(12) United States Patent
Tobar et al.

(10) Patent No.: US 10,290,916 B2
(45) Date of Patent: May 14, 2019

(54) MICROWAVE FREQUENCY MAGNETIC FIELD MANIPULATION SYSTEMS AND METHODS AND ASSOCIATED APPLICATION INSTRUMENTS, APPARATUS AND SYSTEM

(71) Applicant: The University of Western Australia, Crawley, Western Australia (AU)

(72) Inventors: Michael Edmund Tobar, City Beach (AU); Maxim Goryachev, Rivervale (AU)

(73) Assignee: The University of Western Australia, Crawley, Western Australia (AU)

(*) Notice: Subject to any disclaimer, the term of this patent is extended or adjusted under 35 U.S.C. 154(b) by 15 days.

(21) Appl. No.: 15/503,429

(22) PCT Filed: Aug. 12, 2015

(86) PCT No.: PCT/AU2015/000485
§ 371 (c)(1),
(2) Date: Feb. 13, 2017

(87) PCT Pub. No.: WO2016/023070
PCT Pub. Date: Feb. 18, 2016

(65) Prior Publication Data
US 2017/0237144 A1   Aug. 17, 2017

(30) Foreign Application Priority Data
Aug. 12, 2014   (AU) .................................. 2014903143

(51) Int. Cl.
*H01P 7/06*   (2006.01)
*H01P 1/205*   (2006.01)
(Continued)

(52) U.S. Cl.
CPC .............. *H01P 7/06* (2013.01); *H01P 1/2053* (2013.01); *H03H 9/17* (2013.01); *H03H 9/54* (2013.01); *H05K 7/20* (2013.01)

(58) Field of Classification Search
CPC ... H01P 7/06; H03H 9/17; H03H 9/54; H05K 7/20
(Continued)

(56) References Cited

U.S. PATENT DOCUMENTS 6,549,092 B1 * 4/2003 Hattori .................. H01P 1/2053
                                                           333/134
2008/0068112 A1   3/2008 Yu et al.
2012/0169435 A1   7/2012 Kaneda et al.

FOREIGN PATENT DOCUMENTS

JP   2011256455   12/2011
WO  2008036180    3/2008

OTHER PUBLICATIONS

International Search Report and Written Opinion for Application No. PCT/AU2015/000485 dated Oct. 21, 2015 (12 pages).

* cited by examiner

*Primary Examiner* — Benny T Lee
*Assistant Examiner* — Hafizur Rahman
(74) *Attorney, Agent, or Firm* — Michael Best & Friedrich LLP

(57) ABSTRACT

A microwave frequency magnetic field manipulation system 10 comprises a re-entrant microwave cavity 12 having a substantially continuous and closed internal surface 14 with at least two opposite sides 16 and 18. Two or more posts, P1, P2, ... Pn (hereinafter referred to in general as "posts P") are provided in the cavity 12. The posts P are in physical and more particularly electrical contact with one of the sides 16. Respective gaps G are or can be formed between free ends of the posts P and the side 18. The system 10 also has a
(Continued)

signal source 20 coupled to the cavity 12 for supplying microwaves. The source 20 supplies microwave signals at frequencies that facilitate the generation of magnetic fields in opposite directions about at least two mutually adjacent posts P. Accordingly the magnetic field is reinforced in a common region 22 between the mutually adjacent posts P.

20 Claims, 14 Drawing Sheets

(51) Int. Cl.
    *H03H 9/17*         (2006.01)
    *H03H 9/54*         (2006.01)
    *H05K 7/20*         (2006.01)

(58) Field of Classification Search
    USPC .......................................................... 333/232
    See application file for complete search history.

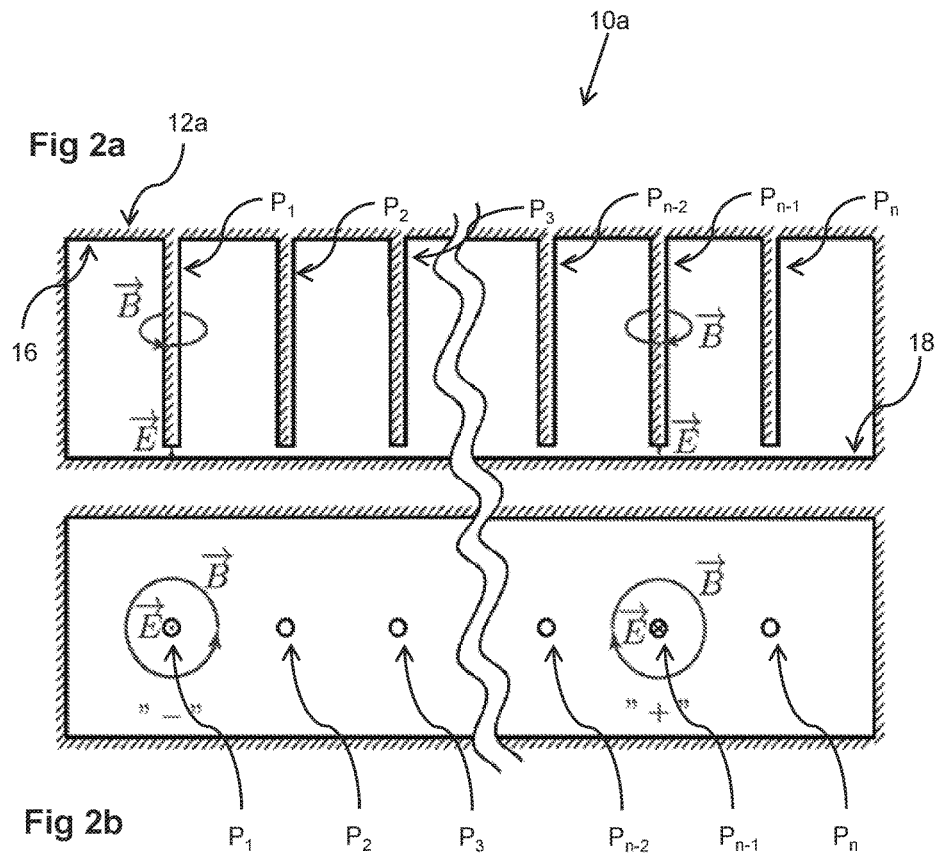

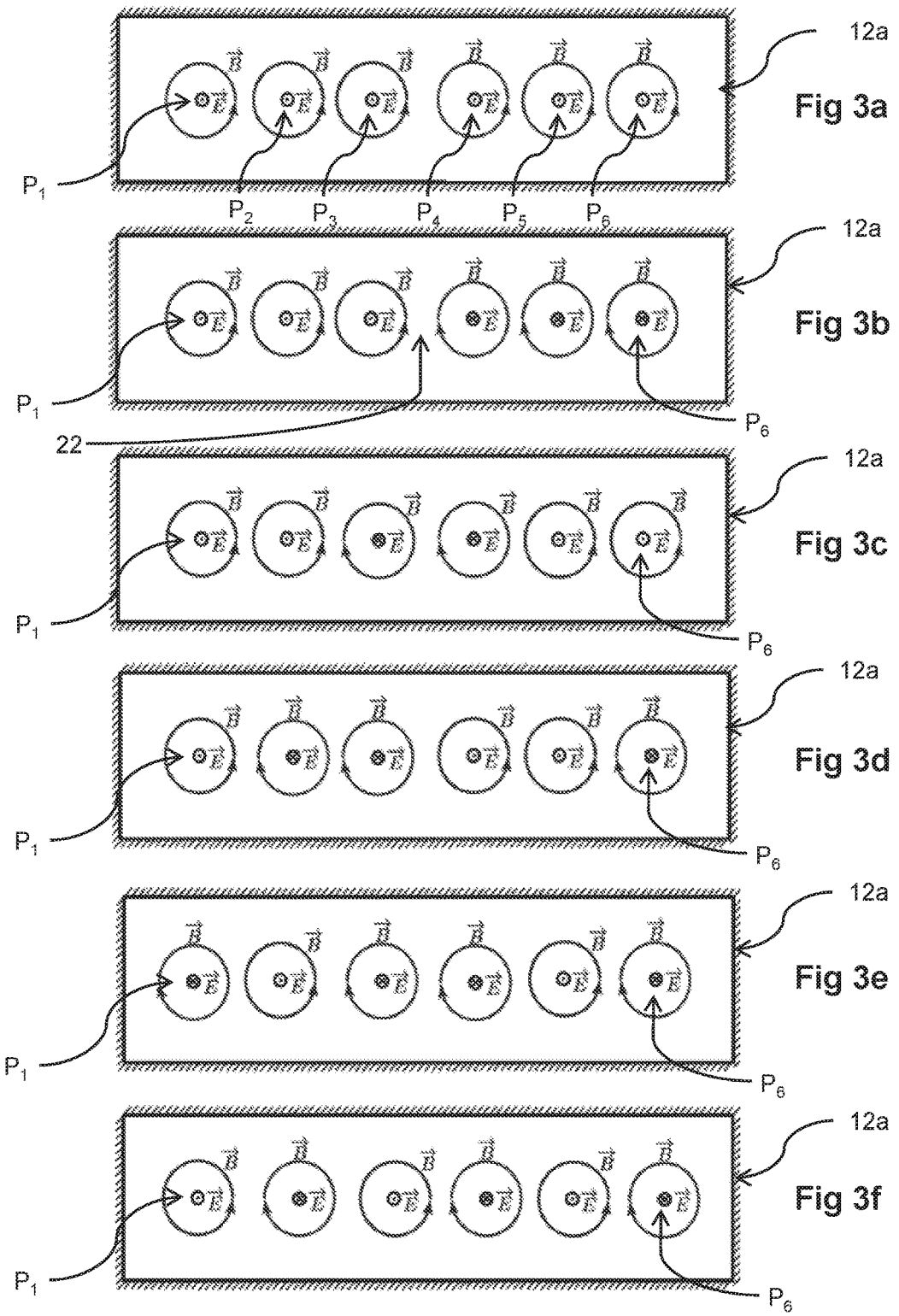

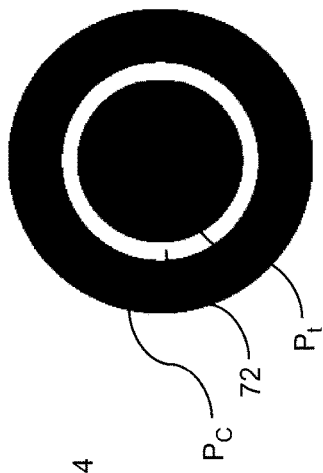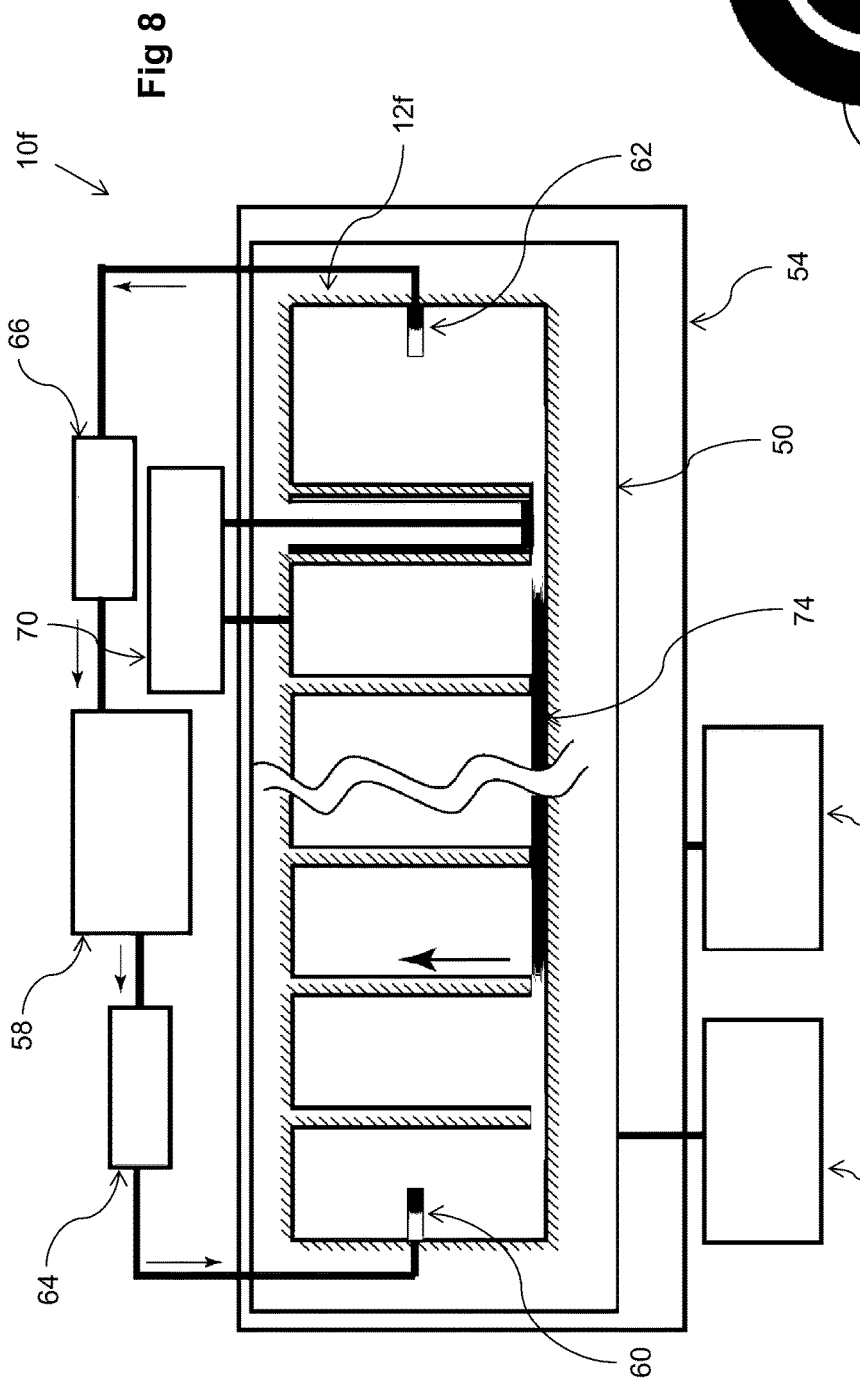

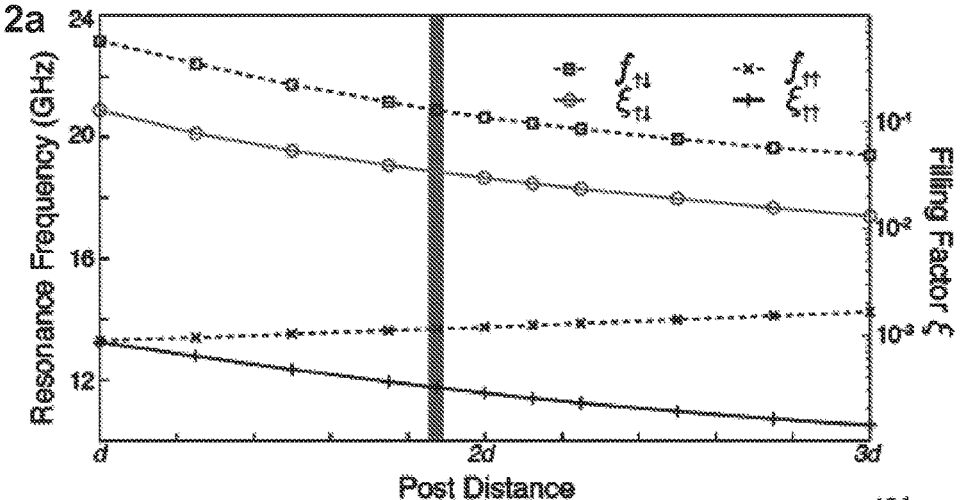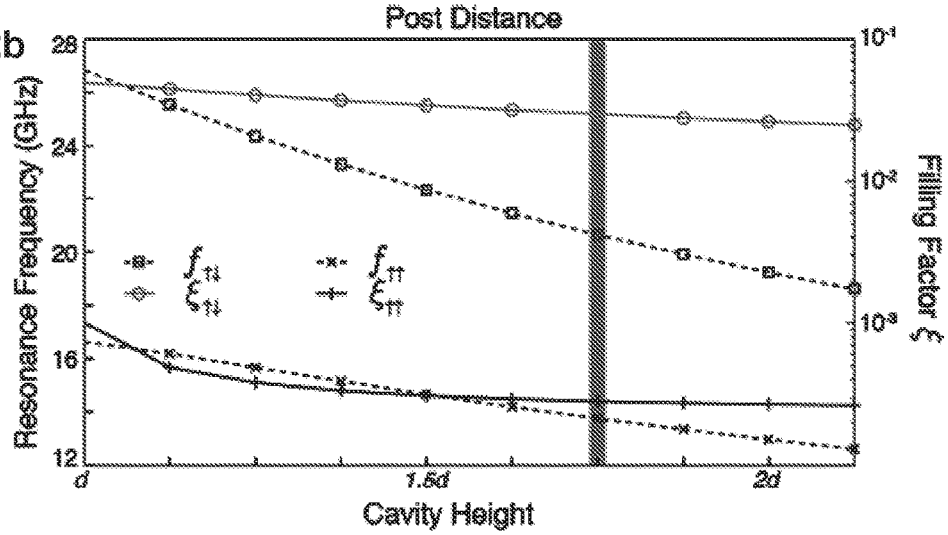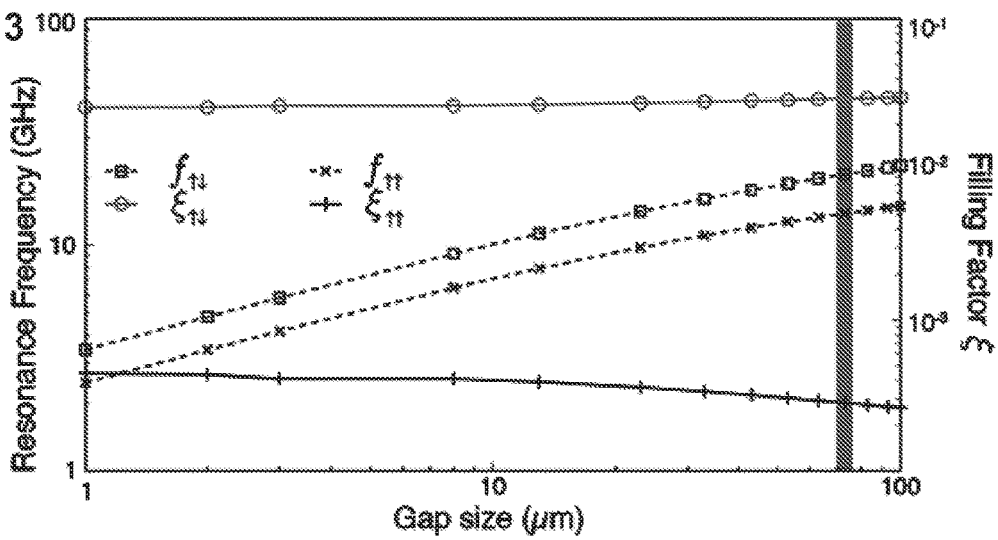

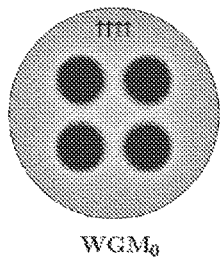 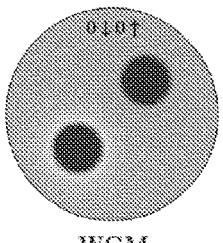 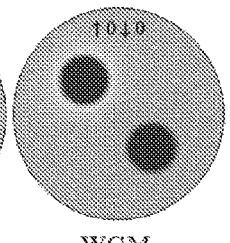 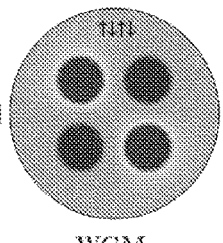
Fig 17Aa    Fig 17Ab    Fig 17Ac    Fig 17Ad
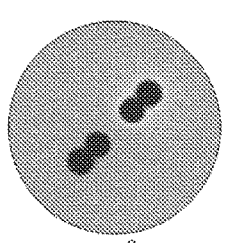 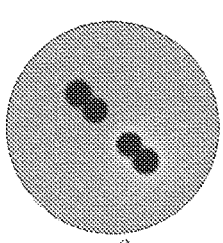 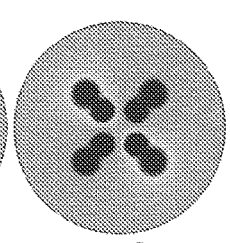 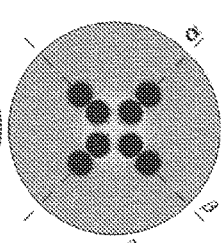
Fig 17Ba    Fig 17Bb    Fig 17Bc    Fig 17Bd
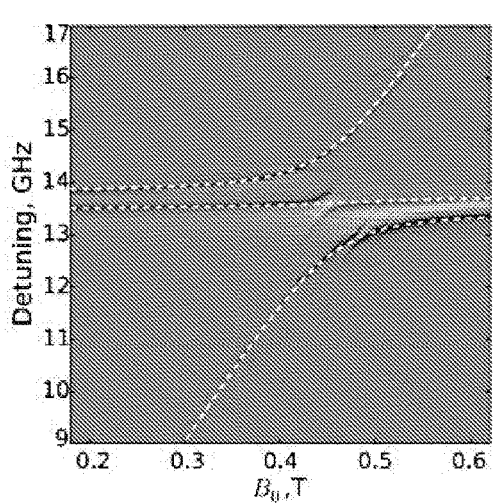 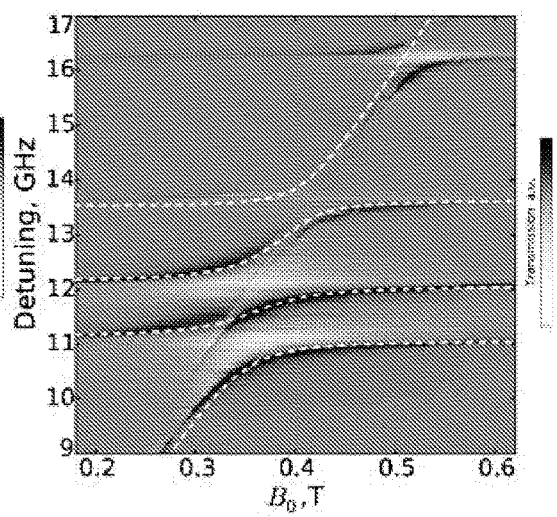
Fig 18a            Fig 18b

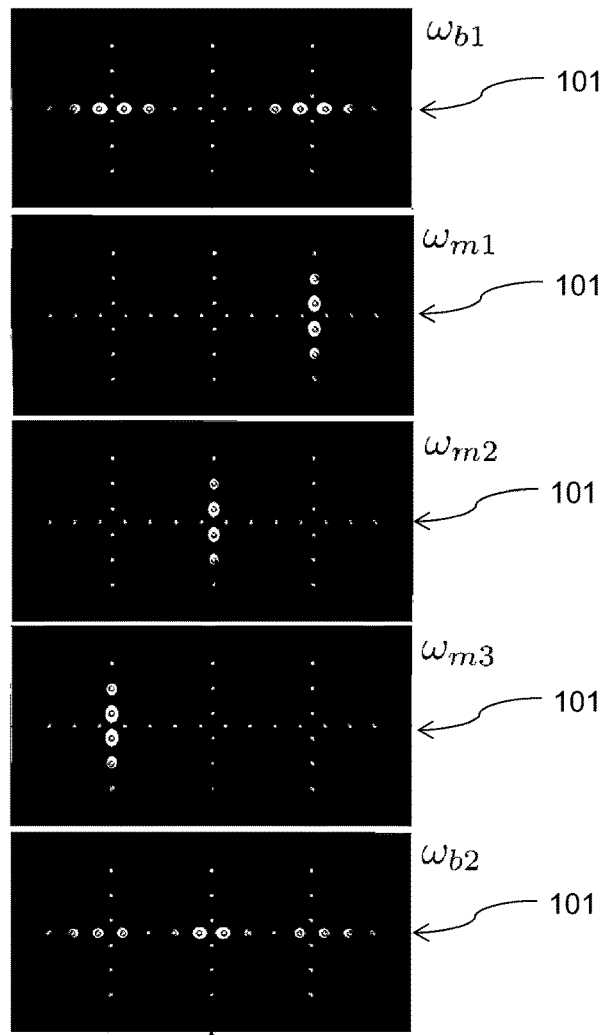
Fig 20a
Fig 20b
Fig 20c
Fig 20d
Fig 20e
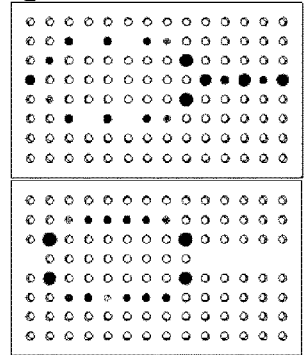
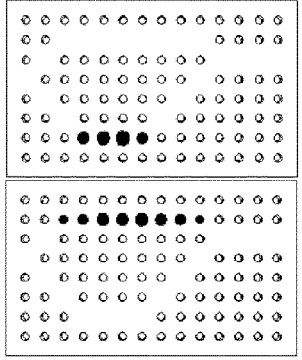
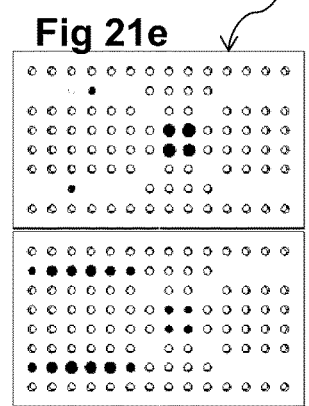
Fig 21a  Fig 21c  Fig 21e
Fig 21b  Fig 21d  Fig 21f

MICROWAVE FREQUENCY MAGNETIC FIELD MANIPULATION SYSTEMS AND METHODS AND ASSOCIATED APPLICATION INSTRUMENTS, APPARATUS AND SYSTEM

TECHNICAL FIELD

The present disclosure is in relation to microwave frequency magnetic field manipulation systems and methods as well as instruments, apparatus and systems and associated application instruments, methods and systems.

BACKGROUND

The disclosed systems and methods have their genesis in the field of quantum information. Ongoing development of devices and experimental techniques that utilize the quantum nature of matter to perform storage, transfer and processing of quantum information is critical to achieve the ambitious goal of workable quantum computation. The mainstream framework used to reach this goal is known as quantum electro dynamics (QED). Under this framework, a high-fidelity technology must be able to exchange information with preserved coherence, i.e. to demonstrate the so called strong coupling regime, in order to be useful for any quantum application. This situation is characterized by a coupling between two subsystems that is stronger than the mean of the losses in both of them. Achieving operation in such a regime is a challenging task, because one usually encounters contradictory requirements for the coupling of a system to its environment.

The Applicants have discovered that coupling can be achieved by use of a microwave resonant cavity. FIG. 1b shows a prior art microwave cavity system has cavity 12 with a substantially continuous and closed internal surface 14 with at least two opposite sides 16 and 18. Two posts, P1 and P2 are provided in the cavity 12. The posts P1 and P2 are in physical and more particularly electrical contact with one of the sides 16. The electrical contact is a short circuit. The posts P extend toward but terminate short of the opposite side 18. This leaves respective gaps G1 and G2 between free ends of the posts P1, P2 and the side 18. This prior art microwave cavity system is operated in a primary mode where the microwaves are supplied at the fundamental frequency so that electric fields E, at any one instant, are in the same direction for the gaps G1 and G2 and thus the magnetic fields B are always in-phase. In this circumstance the cavity 12 may be described as operating in the dark mode or dark cavity mode.

The disclosed systems and methods were initially derived to attempt to achieve an ultra-strong coupling system that could be used as a building block for high-fidelity hybrid quantum system architecture.

The above referenced background is not intended to limit the application of this disclosed system and method. Indeed as will be readily apparent from the following description embodiments of the disclosed systems and methods have substantially greater application and in particular application outside of the realm of quantum information and computation.

SUMMARY OF THE DISCLOSURE

In broad terms the disclosed methods and systems are based on the ability to produce a number of microwave frequency magnetic fields that can be manipulated to interact with each other to produce a particular or desired magnetic field strength profile pattern. This may include for example regions of very high magnetic field strength where two magnetic fields interact to reinforce each other. This in effect focuses the interacting magnetic fields.

In one aspect there is disclosed a microwave frequency magnetic field manipulation system comprising:
 a re-entrant microwave cavity resonator having a substantially continuous and closed internal surface with at least two opposed sides, and at least two posts which are in physical contact with a first of the two opposed sides and extend toward a second of the two opposed sides the posts being dimensioned or positionable to form or enable the formation of respective gaps between free ends posts and the second of the two opposed sides; and
 one or more signal sources coupled to the cavity for supplying microwave signals to facilitate the generation of electric fields in the gaps and associated magnetic fields in opposite direction about two mutually adjacent posts such that the magnetic fields reinforce each other in a focusing region between the two mutually adjacent posts.

In a second aspect there is disclosed a microwave frequency magnetic field manipulation system comprising:
 a re-entrant microwave cavity resonator having a substantially continuous and closed internal surface with at least two opposed sides, and at least two posts which are in physical contact with a first of the two opposed sides and extend toward but terminate short of a second of the two opposed sides to leave respective gaps between free ends posts and the second of the two opposed sides; and
 one or more signal sources coupled to the cavity for supplying microwave signals to facilitate the generation of magnetic fields in opposite direction about two mutually adjacent posts such that the magnetic fields reinforce each other in a focusing region between the two mutually adjacent posts.

In a third aspect there is disclosed a microwave frequency magnetic field manipulation system comprising:
 a re-entrant microwave cavity resonator having a substantially continuous and closed internal surface with at least two opposed sides, and at least two posts which are in physical contact with a first of the two opposed sides and extend toward a second of the two opposed sides the posts being dimensioned or positionable to form or enable the formation of respective gaps between free ends posts and the second of the two opposed sides; and
 one or more signal sources coupled to the cavity for supplying microwave signals at resonant frequencies above the fundamental frequency of the cavity to facilitate the generation of electric fields in the gaps and associated magnetic fields in opposite direction about two mutually adjacent posts such that the magnetic fields reinforce each other in a focusing region between the two mutually adjacent posts.

In a fourth aspect there is provided a microwave frequency magnetic field manipulation system comprising:
 a re-entrant microwave cavity resonator having a substantially continuous and closed internal surface with at least two opposed sides, and at least two posts which are in physical contact with a first of the two opposed sides and extend toward but terminate short of a second of the two opposed sides to leave respective gaps between free ends posts and the second of the two opposed sides; and one or more signal sources coupled to the cavity for supplying microwave signals at resonant frequencies above the fundamental frequency of the cavity to facilitate the generation of magnetic fields in opposite direction about two mutually adjacent posts such that the magnetic fields reinforce each other in a focusing region between the two mutually adjacent posts.

In one embodiment of either aspect the resonator may comprise two or more signal sources wherein the sources are capable of supplying microwaves independently of each other.

In one embodiment of either aspect the resonator may comprise a tuning system arranged to enable variation of dielectric properties of the each gap independently of each other.

In one embodiment the tuning system may comprise a mechanism capable of varying a length dimension of each gap independently of each other.

In one embodiment the tuning system may comprise one or more pieces of dielectric material configured to be capable of insertion into and removal from respective gaps.

In one embodiment of either aspect the posts may be arranged in a one dimensional array.

In one embodiment the posts may be evenly spaced apart.

In one embodiment the spacing between posts in a first pair of adjacent posts may be different to spacing between posts in a second pair of adjacent posts.

In one embodiment of either aspect the posts may be arranged in a two dimensional array.

In one embodiment the posts in at least one direction of the two dimensional array may be evenly spaced apart.

In one embodiment in at least one direction of the two dimensional array, spacing between posts in a first pair of adjacent posts may be different to spacing between posts in a second pair of adjacent posts.

In one embodiment of either aspect the posts may be arranged in a three dimensional array.

In one embodiment of either aspect the posts may comprise at least two different types of post wherein posts of different type differ in one or both of: transverse dimension; and, transverse shape.

In one embodiment of either aspect the resonator may comprise a DC magnetic field generator arranged to produce a magnetic field having lines of flux extending parallel to a length direction of the posts.

In one embodiment the DC magnetic field generator may be arranged to produce a magnetic field of up to at least 0.5 T.

In one embodiment the DC magnetic field generator may be arranged to produce a magnetic field in the range of 0.0-1 T.

In one embodiment of either aspect the resonator may comprise a crystal resonator disposed in the focusing region between the mutually adjacent posts.

In one embodiment the crystal resonator may be a single crystal resonator.

In one embodiment of either aspect the resonator may comprise a cooling system capable of cooling the cavity to milliKelvin temperatures.

In one embodiment of either aspect the resonator may comprise a DC electric field generator arranged to produce an electric field extending across the gaps in a direction parallel to a length direction of the posts.

In one embodiment of either aspect the resonator may comprise a programmable system associated with the posts and capable of selectively varying the size of the gap for each post individually including closing the gap to zero wherein a post is short circuited across opposed sides of the cavity.

In one embodiment the programmable system may be capable of dynamically varying the size of the gap for each post individually while a signal is propagated through the cavity.

In a fifth aspect there is disclosed a method of producing a focused magnetic field in a multi-post re-entrant microwave cavity resonator having a plurality of posts, each post having one end in direct physical contact with a first portion of an inner surface of the cavity and an opposite end located or positionable to form or enable the formation of a respective gap with a second portion of the inner surface, the method comprising: exciting the cavity with microwave signals at second or higher harmonic frequencies to facilitate generation of electric fields in the respective gaps in directions to form corresponding magnetic fields in opposite direction about two mutually adjacent posts such that the magnetic fields reinforce each other in a focusing region between the two mutually adjacent posts In a sixth aspect there is disclosed a method of producing a focused magnetic field in a multi-post re-entrant microwave cavity resonator having a plurality of posts each of which have one end in direct physical contact with a first portion of an inner surface of the cavity and an opposite end spaced from and a second portion of the inner surface to leave respective gaps between opposite ends of the posts and the second portion of the surface, the method comprising: exciting the cavity with microwave signals at a second or higher harmonic frequencies to facilitate generation of magnetic fields in opposite direction about two mutually adjacent posts such that the magnetic fields reinforce each other in a focusing region between the two mutually adjacent posts.

In one embodiment exciting the cavity may comprise exciting the cavity simultaneously with a plurality of microwaves of mutually different second or higher harmonic frequencies.

In one embodiment the method may comprise varying a size of each gap.

In one embodiment the size of each gap may be varied independently of each other.

In one embodiment the method may comprise inserting a solid dielectric material in respective gaps.

In one embodiment the method may comprise evacuating the cavity of fluid.

In one embodiment the method may comprise at least partially filling the cavity with a fluid.

In one embodiment the method may comprise evacuating the cavity of a first fluid and subsequently at least partially filling the cavity with a second fluid which is different to the first fluid.

In one embodiment the method may comprise placing a crystal resonator in the one focusing region.

In a seventh aspect there is disclosed a method of inducing ultra-strong photon magnon coupling comprising:

placing a crystal resonator in a focusing region of a microwave cavity; and exciting the cavity at a second or higher order eigen-frequencies which produces at least two magnetic fields such that the magnetic fields reinforce each other in the focusing region.

In one embodiment the method may comprise providing the microwave cavity with at least two posts which are in physical contact with a first of two opposed inside surfaces of the cavity and extend toward but terminate short of a second of the two opposed inside surfaces to leave respective gaps between free ends posts and the second of the two the two opposed inside surfaces; wherein the respective ones of the magnetic fields are generated and circulate about individual posts. More particularly in this embodiment the method may comprise arranging at least two posts in the microwave cavity so that one end of each post is in physical contact with a first of two opposed inside surfaces of the cavity and an opposite end of each post is positioned or positionable to form or enable the formation of respective gaps between free ends posts and a second of the two opposed inside surfaces; and wherein exciting the cavity comprises exciting the cavity with microwaves to produce electric fields in the gaps in directions to produce associated respective ones of the magnetic fields that circulate about corresponding individual posts.

In one embodiment the method may comprise configuring the cavity relative to the crystal resonator to provide a filling factor in the crystal resonator of at least 5% wherein the filling factor is a portion of total cavity magnetic energy stored in the crystal resonator.

In one embodiment the method may comprise configuring the cavity relative to the crystal resonator to provide a filling factor of at least 10%.

In one embodiment the method may comprise configuring the cavity relative to the crystal resonator to provide a filling factor in the range of 10% to 25%.

In one embodiment the method may comprise configuring the cavity relative to the crystal resonator to provide a cavity photon to crystal magnon coupling of at least 1 GHz.

In one embodiment the method may comprise configuring the cavity relative to the crystal resonator to provide a cavity photon to crystal magnon coupling of at least 2 GHz.

In one embodiment the method may comprise configuring the cavity relative to the crystal resonator to provide a cavity photon to crystal magnon coupling of at least 10% of the cavity resonant frequency.

In one embodiment configuring the cavity may comprise setting a spacing A between mutually adjacent posts.

In one embodiment the method may comprise providing mutually adjacent posts with a spacing A where d≤A≤3d and where d=diameter of the single crystal resonator In one embodiment the method may comprise arranging the spacing A such that: d≤A≤1.2d.

In one embodiment configuring the cavity may comprise setting a transverse distance B between the two opposed insides surfaces of the cavity in the ranged ≤B≤2d and where d=diameter of the crystal resonator.

In one embodiment the method may comprise arranging the transverse distance B such that: d≤B≤1.1d.

In one embodiment the method may comprise varying the size of the gaps.

In one embodiment the method may comprise varying the size of the gaps to be in a range of 0-100 µm.

In one embodiment the method may comprise applying a DC magnetic field to the crystal resonator in a direction perpendicular to planes containing the at least two magnetic fields generated by the exciting of the cavity.

In one embodiment the method may comprise varying a field strength of the DC magnetic field.

In an eight aspect there is disclosed a re-entrant microwave cavity resonator system comprising a re-entrant microwave cavity resonator having a substantially continuous and closed internal surface with at least two opposed sides, and at least two posts which are in physical contact with a first of the two opposed sides and extend toward a second of the two opposed sides the posts being dimensioned or positionable to form or enable the formation of respective gaps between free ends posts and the second of the two opposed sides; and one or more signal sources coupled to the cavity for supplying microwave signals to facilitate the generation of electric fields in the gaps and associated magnetic fields in opposite direction about two mutually adjacent posts such that the magnetic fields reinforce each other in a focusing region between the two mutually adjacent posts.

In a ninth aspect there is disclosed a re-entrant microwave cavity resonator system comprising: a re-entrant microwave cavity resonator having a substantially continuous and closed internal surface with at least two opposed sides, and at least two posts which are in physical contact with a first of the two opposed sides and extend toward a second of the two opposed sides the posts being dimensioned or positionable to form or enable the formation of respective gaps between free ends posts and the second of the two opposed sides; and one or more signal sources coupled to the cavity for supplying microwave signals at resonant frequencies above the fundamental frequency of the cavity to facilitate the generation of electric fields in the gaps and associated magnetic fields in opposite direction about two mutually adjacent posts such that the magnetic fields reinforce each other in a focusing region between the two mutually adjacent posts.

In a tenth aspect there is disclosed a re-entrant microwave cavity resonator comprising a substantially continuous and closed internal surface with at least two opposed sides, and at least two posts which are in physical contact with a first of the two opposed sides and extend toward a second of the two opposed sides the posts being dimensioned or positionable to form or selectively enable the formation of respective gaps between free ends posts and the second of the two opposed; and a tuning system arranged to enable variation of a size of the gaps. This may include varying the gap size so that it can be closed to zero and thereby short circuit a post across the opposite sides of the internal surface of the cavity.

The features of embodiments of the first four aspects pertaining to the microwave frequency magnetic field manipulation system may also be or otherwise form or constitute features of the re-entrant microwave cavity resonator system, or the re-entrant microwave cavity resonator in accordance with the above eighth, ninth or tenth aspects.

BRIEF DESCRIPTION OF THE DRAWINGS

Notwithstanding any other forms which fall within the scope of the method as set forth in the Summary, a specific embodiment will now be described by way of example only, with reference to the accompanying drawings in which:

FIG. 2a is a schematic representation of a multi-post re-entrant microwave cavity that may be used in embodiments of the disclosed microwave frequency magnetic field manipulation system;

FIG. 2b is a further view of the multi-post re-entrant microwave cavity of FIG. 2a but viewed in an orthogonal plane;

FIGS. 3a-3f depict magnetic field and electric field orientation in each of six possible modes of a six post re-entrant microwave cavity that may be used in an embodiment of the disclosed microwave frequency magnetic field manipulation system;

FIG. 8 is a schematic representation of the disclosed system operating as an electric field spectrometer;

FIG. 9 is a section view of a post in a microwave re-entrant cavity utilized in the electric field spectrometer shown in FIG. 8 and arranged to apply a DC electric field bias;

FIG. 12(a): Depicts a simulation of cavity resonance frequencies and YIG sphere filling factors as a function of the distance between the two posts for both the dark and bright modes. The distance is given in terms of the YIG sphere diameter d.

FIG. 12(b) Depicts a simulation of cavity resonance frequencies and YIG sphere filling factors as a function of the cavity height, for both the dark and bright modes. The distance is given in terms of the YIG sphere diameter d.

FIG. 13: Depicts a simulation of cavity resonance frequencies and YIG sphere filling factor as a function of the post gap size, for both the dark and bright modes.

FIGS. 17Aa-17Ad illustrate electric field distribution within the gaps inside a four post two dimensional array embodiment of the disclosed cavity;

FIGS. 17Ba-17Bd illustrate electric field distribution within the gaps inside an eight post two dimensional array embodiment of the disclosed cavity;

FIG. 18A depicts a density plot of the transmission as a function of frequency and applied DC magnetic field through for the four post cavity shown in FIGS. 17Aa-17Ad. FIG. 18B depicts the equivalent density plot for the eight post cavity shown in FIGS. 17Ba-17Bd;

FIGS. 20A-20E illustrate possible magnetic field distribution for an embodiment of the disclosed cavity that consists of four 1D re-entrant multi post sub arrays each of which simulates respective Fabry-Perot cavities and may be used for quantum state transfer and memory; and FIGS. 21A-21F depict electric field distributions for various transmission modes for three examples of the post arrangements in an embodiment of the disclosed cavity, which is programmable.

DESCRIPTION OF SPECIFIC EMBODIMENTS

Figure 1A:
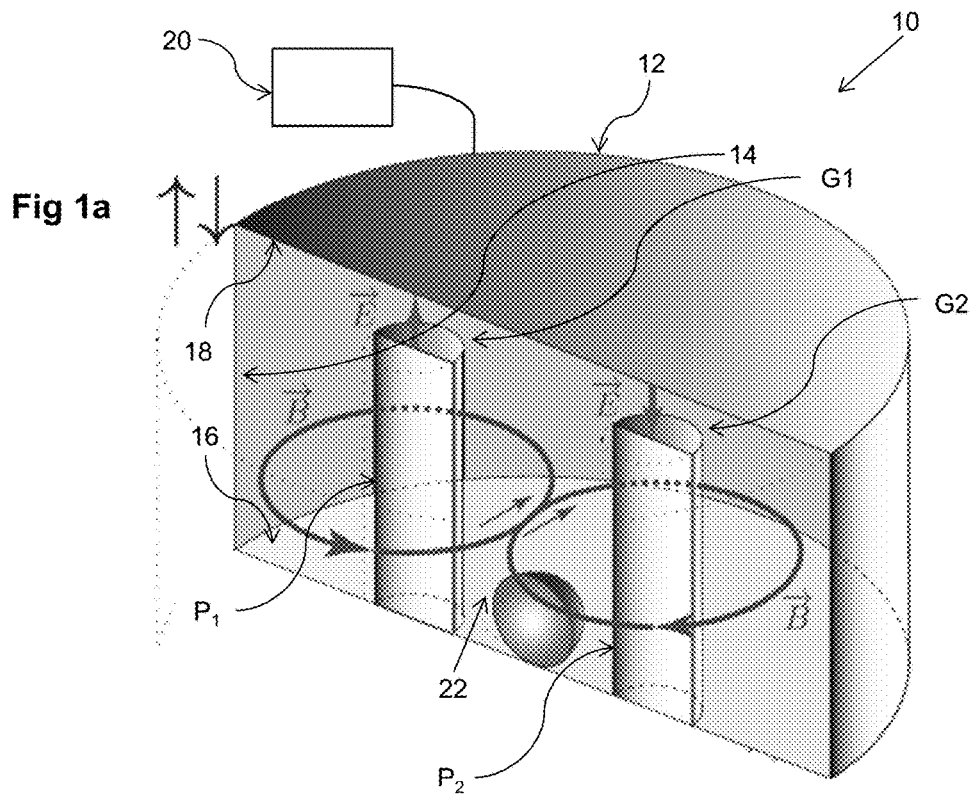
FIG. 1a is a schematic representation of an embodiment of the disclosed microwave frequency magnetic field manipulation system operating in a bright mode.

FIG. 1a is a schematic representation of a basic embodiment of the disclosed microwave frequency magnetic field manipulation system 10 (hereinafter referred to in general as "system 10"). The system 10 comprises a re-entrant microwave cavity 12 having a substantially continuous and closed internal surface 14 with at least two opposite sides 16 and 18. Two posts, P1 and P2 (hereinafter referred to in general as "posts P") are provided in the cavity 12. The posts P1 and P2 are in physical and more particularly electrical contact with one of the sides 16. The electrical contact is a short circuit. The posts P extend toward but terminate short of the opposite side 18. This leaves or produces respective gaps G1 and G2 (hereinafter referred to in general as "gaps G") between free ends of the posts P and the side 18. The system 10 also has a signal source 20 coupled to the cavity 12 for supplying microwaves. The source 20 is depicted here as a single source. However the source 20 may provide a single output; or multiple outputs so as to act as more than one source; or alternately the source 20 may be one of a plurality of sources. The source 20 supplies microwave signals at frequencies that facilitate the generation of magnetic fields in opposite directions about the posts P1 and P2. Accordingly the magnetic field is reinforced in a common region 22 between the posts P1 and P2. The frequencies that result in the generation of magnetic fields that reinforce in the common region 22 are resonant frequencies (also known as eigenfrequencies) above the fundamental frequency. When the magnetic fields between two adjacent posts in the cavity 12 reinforce in the common region 22 the cavity may be described as operating in the bright mode or bright cavity mode (denoted with the symbol ↑↓). Also when the cavity 12 is excited at eigenfrequencies above the fundamental frequency of the cavity it is operating in a second or high mode.

Within the re-entrant microwave cavity 12 the electric and magnetic fields are spatially separated. Substantially all of the electric field represented by the letter E is almost totally concentrated in the gaps G. The magnetic field represented by the letter B is distributed around the posts P decaying with the square of distance in the radial direction. By providing microwaves at frequencies above the fundamental frequency it is possible to manipulate the direction of the electric field in the gaps G and therefore correspondingly manipulate the direction of the magnetic field B about the corresponding post P.

Figure 1B:
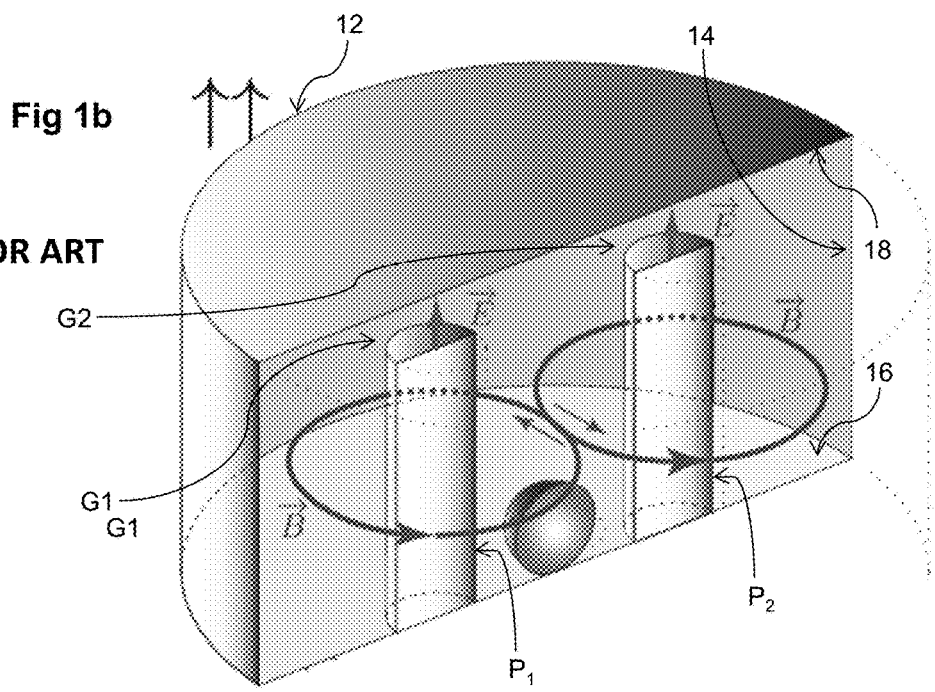
FIG. 1b is a schematic representation of a prior art re-entrant microwave cavity operating in a dark mode.

In the event that the cavity is operated in the normal (primary) mode where the microwaves are supplied at the fundamental frequency the electric fields E, at any one instant, are in the same direction for every gap G and thus the magnetic fields B are always in-phase. This is shown in FIG. 1b and is of no interest in relation to the present disclosure. In this circumstance the cavity 12 may be described as operating in the dark mode or dark cavity mode (denoted with the symbol ↑↑). The system of FIG. 1b where the cavity is excited at the fundamental frequency and operates in the dark mode represents prior art. Reference will be made to this throughout the specification for the purposes of comparison with embodiments of the disclosed system and methods.

It has been discovered that by exciting the cavity 12 at eigenfrequencies above the fundamental frequency of the cavity 12 operates in higher order modes and generates magnetic fields about at least one pair of adjacent posts P will be 180° out of phase and thus reinforce each other in the common region 22.

FIGS. 2a and 2b depict a further and more practical embodiment of the system, denoted as system 10a. In describing the system 10a the same reference numbers as per the system 10 will be used to denote the identical features. The system 10a comprises a re-entrant cavity 12a having a one dimensional linear array of n posts Pn where n≥2. The posts P in this embodiment are equally spaced from each other. However alternate embodiments of the system 10a do not require equal spacing of the posts P. The posts P are each in physical and more particularly electrical contact with a surface 16 of the cavity 12a and extend toward but terminate short of an opposite surface 18 to create corresponding gaps G1-Gn. As is also apparent in this instance the cavity 12a is in the shape of a rectangular prism rather than a cylinder as in the previous embodiment. The system 10a is excited by microwaves from a source (not shown). By providing microwaves at eigenfrequencies above the fundamental frequency the electric current induced in at least one lot of two mutually posts P will opposite to each other so that the magnetic fields about those two mutually adjacent posts P will be 180° out of phase and therefore will reinforce in the common region between those posts.

By providing the source 20 as: one that provides multiple simultaneous outputs so as to act as more than one source (i.e. a number of different second or higher order eigenfrequencies); or one of a plurality of sources to produce the same effect, the cavity 12a can be excited by microwaves of different frequencies and different power simultaneously. For example the cavity 12a can be excited by microwaves having frequencies corresponding to the second and fourth order eigenfrequencies. The resultant magnetic field pattern or field strength density in the cavity 12a will be a vector sum of the magnetic fields arising from each of the eigenfrequencies.

It should also be appreciated that there is only one eigenfrequency for which the magnetic field around all successive posts alternate in the same direction at the same instance of time. This will be referred as the fundamental mode of the system or cavity; or the fundamental frequency. For all other modes there will be groups of posts P for which the magnetic fields are orientated in the same direction but there will be an adjacent group of at least one post which have their magnetic field in the same direction as each other but opposite to that of the first group of posts.

To assist in understanding this consider for example if the cavity 12a contained six posts (i.e. Pn−2=P4; Pn−1=P5 and Pn=P6). FIGS. 3a-3f depict schematically the electric E and magnetic B fields associated with each of the posts P1-P6. In these Figures a dot "." is representative of the electric field E along a post P having at the particular depicted instant in time a direction from the surface 18 toward the surface 16 (i.e. upwardly out of the plane of the page). The cross "+" symbol is representative of the electric field E in a post P extending in an opposite direction (i.e. into the plane of the page). The circle and arrow about each post P depict the direction of rotation of the magnetic field B.

FIG. 3a depicts the electric field E and magnetic field B in the cavity 12a at the fundamental frequency. Here the cavity 12a is operating in the fundamental mode. It will be seen that the electric field for each of the posts P is in the same direction and accordingly the direction of the magnetic field about each corresponding post P is in the same rotational direction. Accordingly the magnetic fields in the common region for each set of mutually adjacent posts are mutually destructive. The cavity 12a is operating in the dark mode. Again operation at the fundamental frequency (i.e. in the fundamental or primary mode) is of no interest and outside of the disclosure of the system 10a.

FIG. 3b depicts the electric and magnetic fields E and B in the cavity 12a at a resonance frequency higher than the fundamental frequency. Here the resultant magnetic fields are orientated such that the fields about posts P3 and P4 are in opposite rotational directions and therefore reinforce each other in the common region 22. Accordingly the magnetic field strength in the common region is in essence the sum of the full strength of each magnetic field in the region 22. Stated another way driving the cavity 12a at this frequency produces a focusing of the magnetic fields between posts P3 and P4.

The remaining FIGS. 3c; 3d; 3e; and 3f respectively depict the electric and magnetic fields generated within the cavity 12a at progressively higher resonance frequencies representing the third, fourth, fifth, and sixth modes of operation respectively of the cavity 12a. In each of the second and higher modes there exist at least two adjacent posts P having a common region 22 in which their respective magnetic fields constructively reinforce each other. The number of modes of operation of the system 10 is n−1 where n is the number of gaps G which is also equal to the number of posts P, but it is only modes above the fundamental that are presently of interest and constitute embodiments of the disclosed system 10. (It will be seen that it is only in the sixth mode of operation (FIG. 3O that the magnetic fields about successive posts are out of phase.)

Embodiments of the system 10/10a do not require that the posts P are in a one dimensional array. Indeed the posts may be arranged in two or even three dimensional arrays. Further, it is not a requirement that the posts have the same cross-section or that the cross-section be circular. For example, the posts may have a square or rectangular cross-section. Indeed such cross-sectional shapes can produce even greater intensity and focusing of magnetic fields due to the provision of relatively sharp edges or corners of the posts. In other embodiments the cross-section may be elliptical, in the shape of a polygon, or in the shape of a convex polygon.

Figure 4:
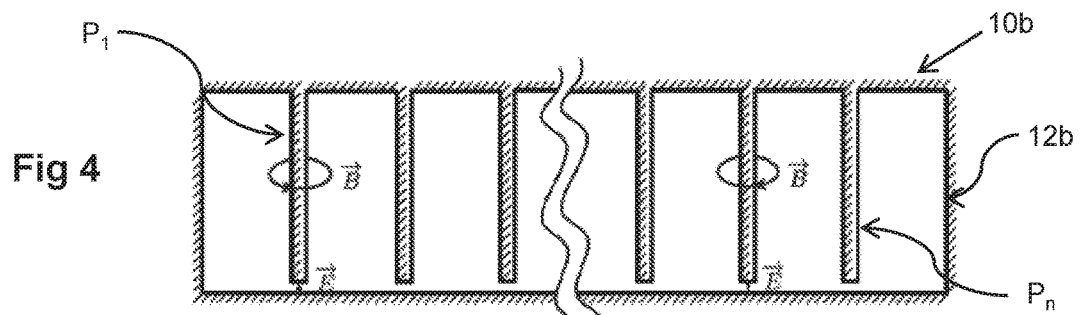
FIG. 4 is a section view in a first plane of a re-entrant microwave cavity having a plurality of posts arranged in a two dimensional array which may be used in embodiments of the disclosed microwave frequency magnetic field manipulation system.
Figure 5:
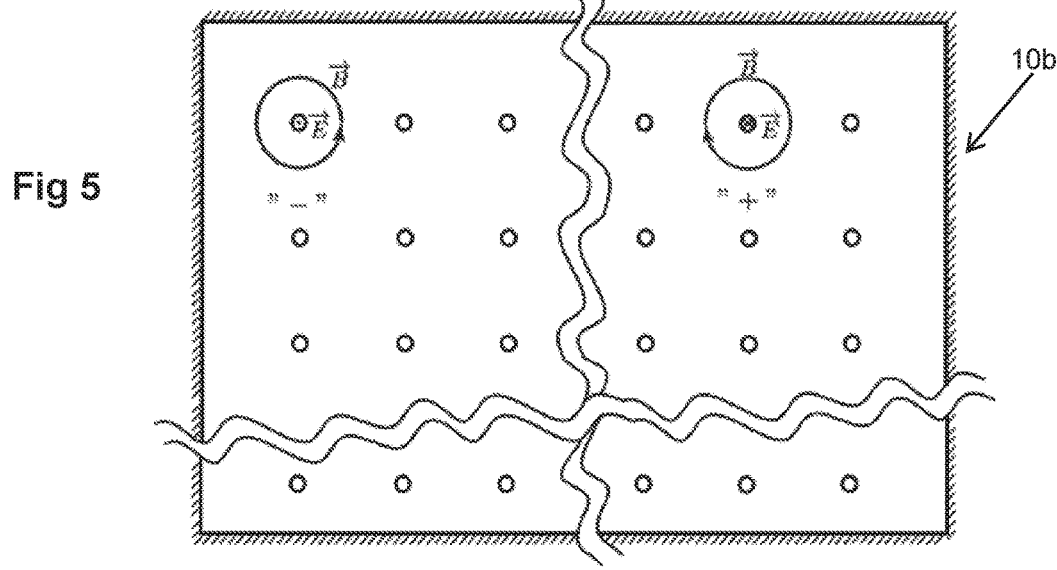
FIG. 5 is a view in a plane orthogonal to that of FIG. 4 of the two dimensional multi-post re-entrant microwave cavity.

FIGS. 4 and 5 provide schematic representation of a systems 10b having corresponding re-entrant microwave cavity 12b with posts arranged into a two dimensional arrays. The re-entrant microwave cavity 12b is formed as a two dimensional array of x.y posts P. Here the corner posts in the array are designated as $P_{1,1}$; $P_{1,y}$; $P_{x,1}$ and $P_{x,y}$.

Figure 6:
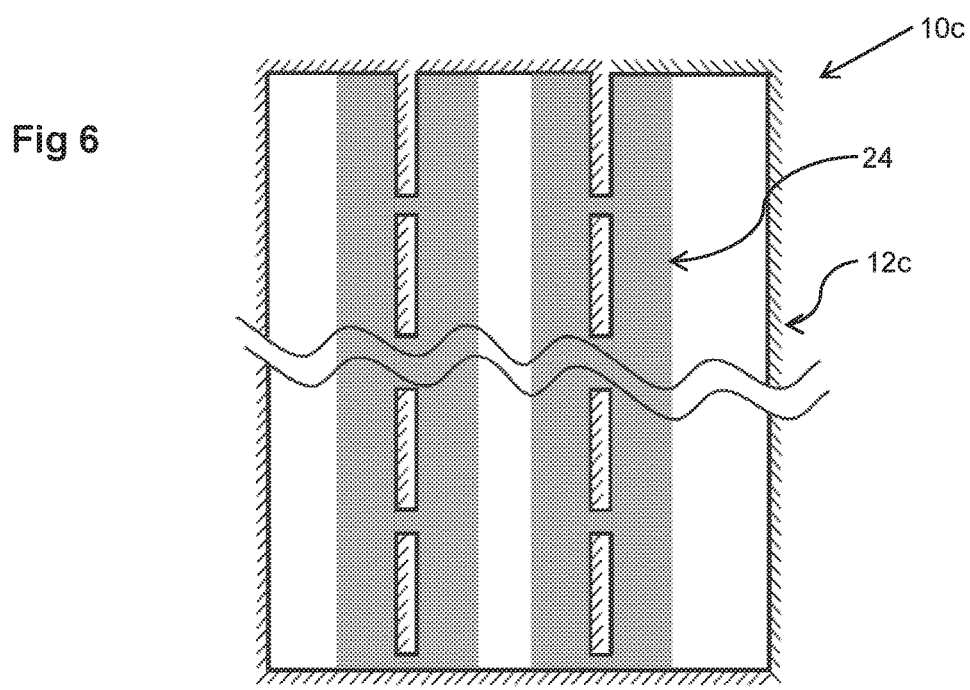
FIG. 6 is a schematic representation of a multi-post re-entrant cavity that may be used in embodiments of the disclosed microwave frequency magnetic field and manipulation system where the cavity has a plurality of posts arranged in a three dimensional array.

FIG. 6 depicts a systems 10c having a re-entrant microwave cavity 12c with posts P in a three dimensional array. The cavity 12c comprises x.y.z posts P. Posts in the z direction may be supported either by way of being embedded in a dielectric material 24 or for example by plastic or other dielectric material tubing which couple mutually adjacent posts in the z direction.

In both of the two and three dimensional arrays the number of useful modes possible is n−1 where n is the number of posts P or the number of gaps G.

It is possible to construct embodiments of systems 10 with cavities 12 where the posts P have different configurations to those shown above. For example the posts may be arranged in a circle. Other systems 10 may have posts arranged in concentric circles. Yet others may arrange the posts disposed in a pattern of a cross or a triangle. The configuration, cross-sectional shape and spacing of the posts; as well as the size of the gaps G may be varied to suit a particular application.

Practical applications and uses of embodiments of the system 10 include but are not limited to magnetic field spectroscopy; electric field spectroscopy; gas/fluid characterisation; quantum information/computing; and pressure sensing. These are exemplified below.

Figure 7:
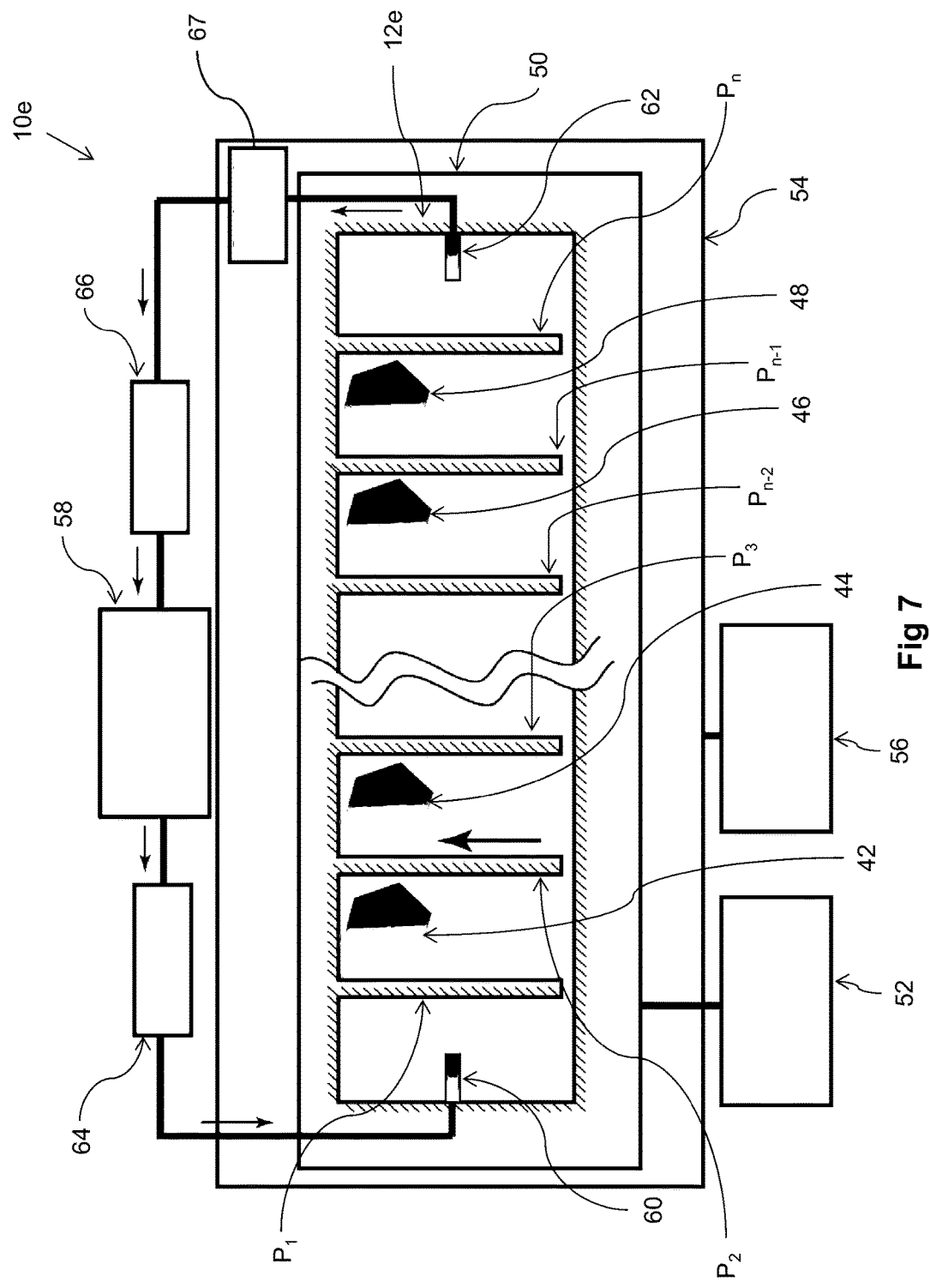
FIG. 7 is a schematic representation of the disclosed system operating as a magnetic field spectrometer.

FIG. 7 depicts an embodiment of the system 10e operated as or otherwise forming part of a magnetic field spectrometer. The system 10e incorporates a re-entrant cavity 12e which may take the form of the one or two dimensional array cavities described above. The system 10e is used to produce specific distributions of magnetic field within the cavity 12e for the purposes of probing magnetic properties of various dielectric materials. The system 10e depicts samples 42, 44, 46 and 48 between respective adjacent pairs of posts P. As a result of the multi-post structure of the cavity 12e the system 10e enables multiple samples to be analyzed at the same time. As previously explained exciting the cavity 12e at different frequencies above the fundamental frequency enables focusing of magnetic field between different adjacent posts. That is the system 10e when operated at different eigenfrequencies enables different samples to be analyzed.

The system 10e in its embodiment comprises an electromagnet 50 in associated controller 52 to provide a DC magnetic field across the samples 42, 44, 46 and 48 within the cavity 12e. Additionally the system 10e in this embodiment is enclosed within an optional cryo-cooler 54 and associated temperature controller 56. The cryo-cooler 54 and temperature controller 56 are operable to control the temperature within the cavity 12e and in particular the temperature of the samples 42, 44, 46 and 48. It is envisaged that the cryo-cooler 54 and controller 56 are operable to reduce temperatures to the milliKelvin range. The system 10e also incorporates a network analyzer 58 which is coupled to cavity probes 60 and 62. The coupling between the network analyzer 58 and probe 60 may be via an optional attenuator 64. The coupling between the network analyzer 58 and the probe 62 may be via an optional amplifier 66. The attenuator 64 is used to reduce thermal noise injected into the cavity 12e from the room temperature measurement setup. The amplifier 66 is used to improve signal-to-noise ratio and thus to improve the resolution. The network analyzer 58 is used to generate the excitation signal, collect the system response signal, analyze and save the data. The circulator 67 is used to reject the amplifier back action noise that can be injected from the amplifier input circuit into the cavity.

FIG. 8 depicts an embodiment of the system 10f operated as or otherwise forming part of an electric field spectrometer. The system 10f incorporates all of the features of the system 10e but in addition a DC electric field system 70. The DC electric system 70 enables the application of a DC electric field along the length of one or more of the posts P. In order to apply the DC field the structure of the posts must be modified. One example of a modification to a post Pn to enable the application of the DC field is shown in FIGS. 8 and 9. Here the post Pn is formed as an outer cylindrical post Pc and an inner electrically conducting post tip Pt. The cylindrical post Pc and post tip Pt are separated by an insulator 72. By connecting the electric DC field system 70 between the cylindrical post Pc and the post tip Pt it is possible to generate a DC field that acts along the post Pn applying a bias to the field within the associated gap G.

In the system 10f samples 74 are placed in the gaps G beneath the posts P. This is the region of concentrated electric field generated by exciting the cavity 12f at frequencies higher than the fundamental frequency. The sample 74 within the gap G affects the electric field across the gap. This electric field is measured or otherwise analyzed by the system 10f and the results can be correlated with characteristics of the sample 74.

Figure 10:
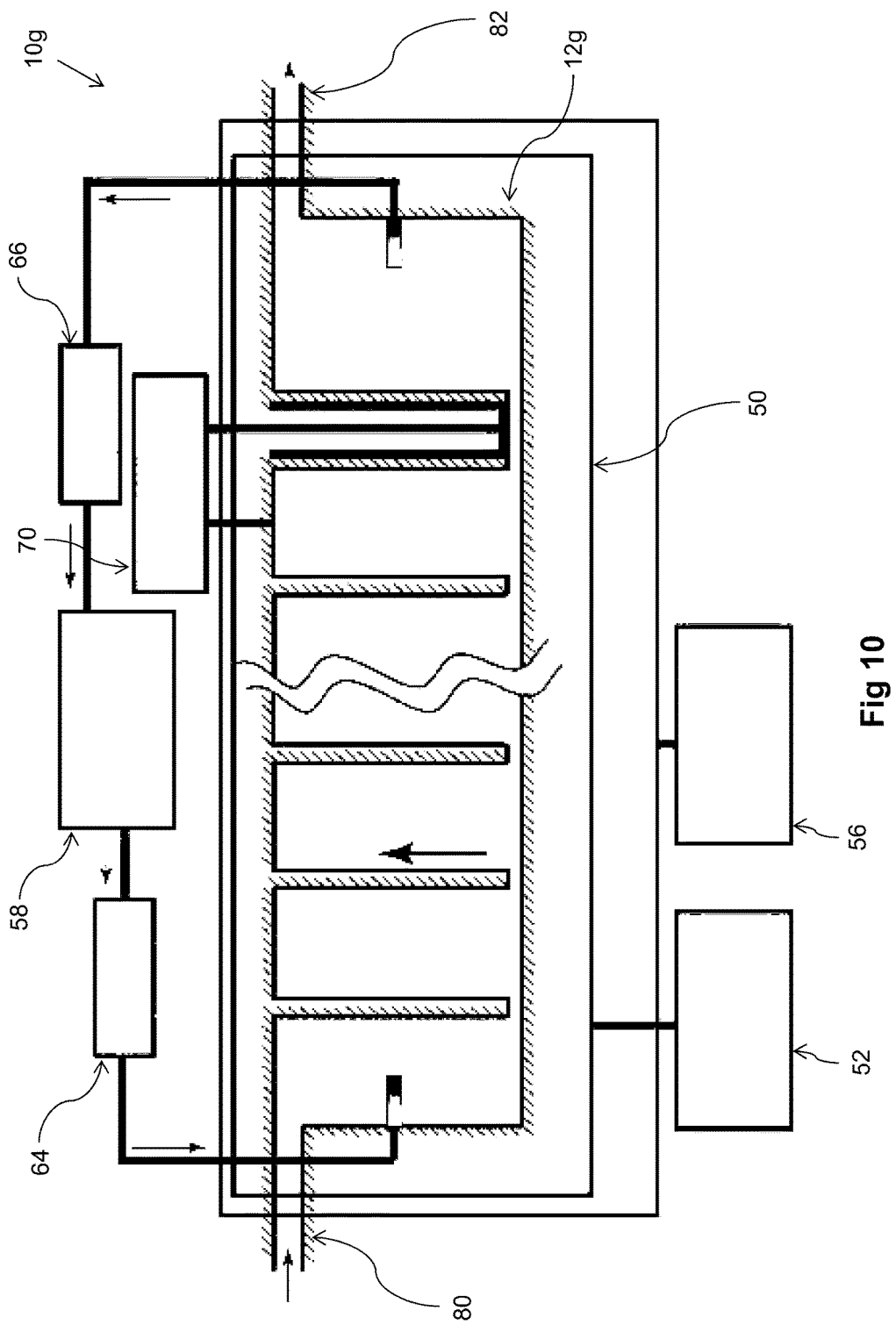
FIG. 10 depicts an embodiment of the disclosed system arranged to facilitate spectroscopy of fluids.

FIG. 10 depicts an embodiment of the system 10g which is arranged to facilitate spectroscopy of fluids. The fluid may be caused to flow through the cavity or it can remain static within the cavity 12g. The system 10g differs from the system 10f only by virtue of the reconfiguration of the cavity 12g to include a fluid inlet 80 and a fluid outlet 82. Valves (not shown) may be placed across the inlet and outlet 80, 82 to control flow of fluid through the cavity 12g or maintain a static volume of fluid within the cavity 12g. By exciting the cavity 12g with microwaves at frequencies above the fundamental frequency various magnetic fields can be generated within the fluid held within the cavity 12g. In addition it is possible to apply DC electric and magnetic fields to the sample by virtue of the magnet 50 and magnetic field controller 52, and the electric DC field via system 70. Thus the fluid within the cavity 12g can be subjected to a huge range of magnetic and electric fields to enable study or analysis of characteristics of the fluid.

System 10g may also be used in to study the electrical response to dielectric materials. The system 10g facilitates the concentration of an electric field or its gradient by for example placing a film or wafer of a sample under different posts, with different posts applying different electric field patters to the sample.

Figure 11:
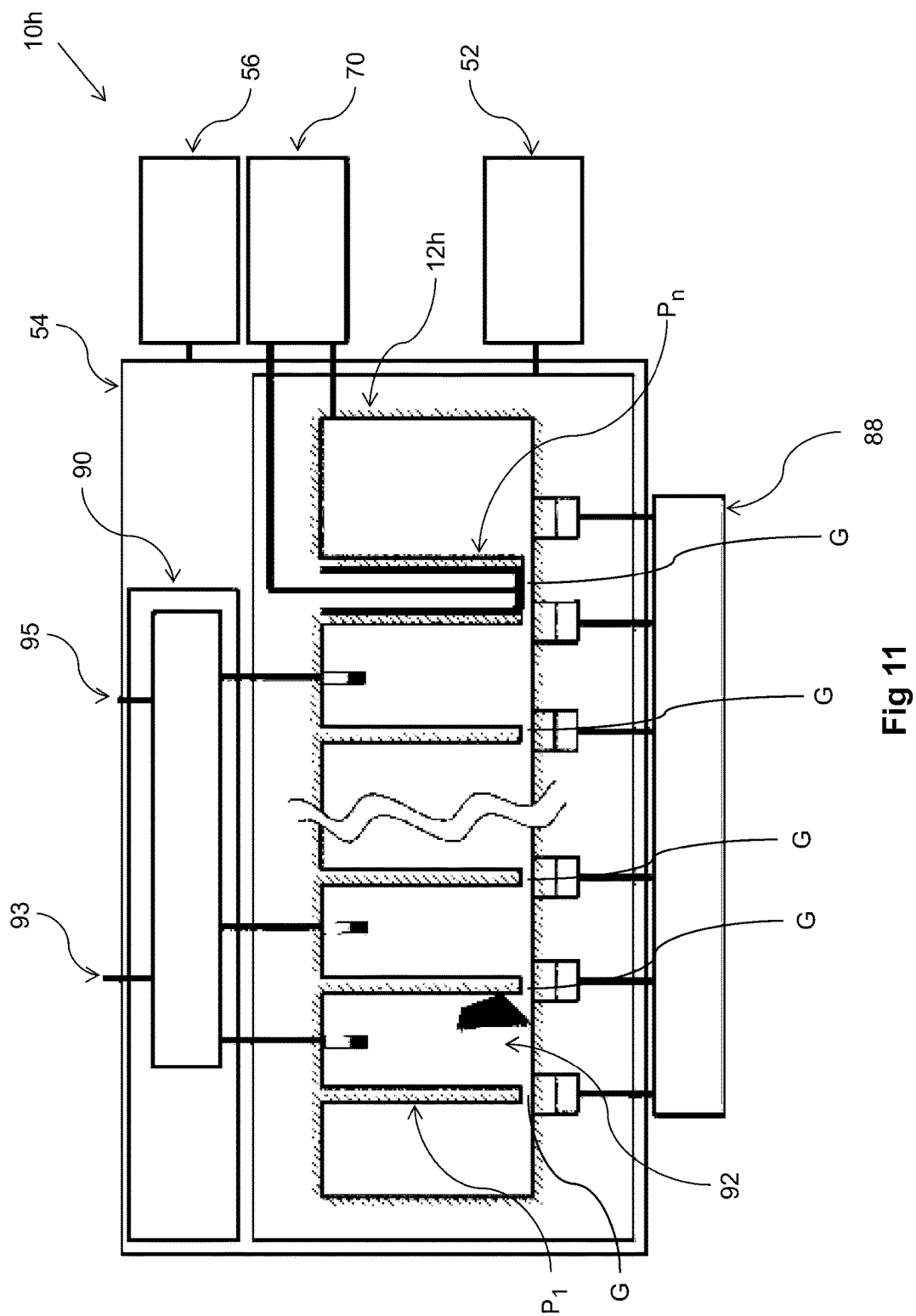
FIG. 11 is an embodiment of the disclosed system 10 arranged to function as an element of a quantum computer.

FIG. 11 is a representation of a system 10h with cavity 12h which can act as an element of a quantum computer. In general terms the system 10h is very similar to the system 10f shown in FIG. 8 but with the addition of an actuator 88; the removal of the network analyzer 58, attenuator 64 and amplifier 66; and the addition of a subsystem 90 with quantum properties that facilitate quantum information manipulation. The system 90 has optical inputs 93 and an external control 95. The purpose of the actuator 88 is to vary the characteristics of each gap G individually. In one example the actuator 88 may be a piezoelectric actuator which is electrically operable to vary the size of the gaps G independently of each other. By applying electric field across respective piezo-electric actuators/crystal, at least one of their dimensions can be varied which in turn can be used to displace a corresponding post and thereby vary the gap size for that post. This provides individual control over each re-entrant mode and as discussed later, the ability to provide a programmable cavity.

The subsystem 90 may come in any form of matter exhibiting quantum properties at low enough temperatures and it is disposed within a cryocooler 54. These may be in the form of Josephson Junctions or qubits. Alternately the subsystem may be in the form of matter 92 such as trapped ions; quantum dots; photonic nano-structures; electronic and nuclear spins in solids; spin-doped dielectric crystals such as $Fe^{3+}$ ions in sapphire and $Er^{3+}$ in YSO; and NV-centers in diamond; single-crystal YIG, or yttrium iron garnet ($Y_3Fe_2(FeO_4)_3$).

YIG exhibits a record low microwave magnetic loss parameter, and excellent dielectric properties at microwave frequencies. For this reason, it has been extensively studied at room temperature for various microwave and optical applications. Strong coupling regimes in YIG nano-magnets have been already predicted, and although some preliminary attempts to couple to magnon resonances in Gd-doped YIG with superconducting planar cavities have been made, no quantum strong coupling regimes have ever been demonstrated due to excess cavity loss. [Magnon modes are a collective excitation of spins of electrons in a crystalline material that can be described as resonances of spin waves.]

However initial tests utilizing embodiments of the system 10$k$ (shown in FIG. 14 and described later below) in which matter 92 in the form of a sub-millimeter sized YIG sphere mounted in a reentrant microwave cavity 12$k$ demonstrate ultra-strong coupling between magnon and photon modes in the system at millikelvin temperatures. The cavity 12$k$ (which in this embodiment is a two post circular cavity similar to cavity 12 of FIG. 1$a$) effectively focuses the resonant magnetic field into the sub-millimeter YIG crystal 92 to achieve the highest filling factor possible at microwave frequencies. This is possible with large magnetic filling factor despite the fact that the smallest resonant frequency of the YIG crystal itself is of the order of 100 GHz. Coupling strength of 2 GHz is achieved for the bright cavity mode that constitutes about 10% of the photon energy, or nearly 76 cavity line widths. Also, a strong coupling regime is observed between a dark cavity mode and a magnon mode, where the photon-magnon coupling reaches 143 MHz.

Due to the peculiar structure of magnon modes in a ferromagnetic material, the optimal shape of a 3D ferromagnetic resonator is a miniature sphere. As such, commercially available YIG crystals 92 typically come in the form of spheres for microwave applications, however technological limitations place bounds on the maximum volume of such crystals. Single-crystal spherical YIG resonators can typically be manufactured with a diameter in the range 200-1000 μm. These dimensions make the corresponding electromagnetic resonance frequencies of modes in the sphere above 100 GHz. Thus, it impossible to utilize the sphere itself as a photon cavity in the X and Ku microwave frequency bands, and one must instead rely on coupling of the ferromagnetic resonance in the sphere to some external resonator, for example a 3D microwave cavity. For a traditional rectangular microwave cavity, the half wavelength of the lowest order standing wave resonance is equal to the cavity size. In the X and Ku bands, the half wavelength is much greater than the diameter of the sphere, strongly reducing the coupling of the sphere to the cavity. It is here that embodiments of the system 10 have application using the ability to focus magnetic field to increase the filling factor of the cavity volume with the YIG material, and thus enhance the coupling. This field-focusing effect results in very high spatial overlap between the photon mode of the cavity and the magnon mode of the YIG crystal, and thus the strong coupling between them. The overlap is usually characterized by a filling factor that denotes the portion of the total cavity magnetic energy stored in the sphere.

Another quantitative parameter of the system 10$h$ is the geometric factor, Gm, calculated as the ratio of the total cavity energy to the energy stored in surface currents. This parameter relates the electromagnetic cavity Q-factor to the surface resistance Rs through the expression Gm=Q×Rs, assuming that this is the dominant loss mechanism.

Finite Element Modelling of the cavity modes allows estimations of the cavity eigenfrequencies, the filling factor ξ and the geometric factor Gm. For the actual cavity dimensions, the predicted resonance frequencies for the dark and bright modes are 13.75 and 20.6 GHz respectively, which is in good agreement with current experiment results.

The filling factors for the two modes are $3\times10^{-4}$ and $3\times10^{-2}$ respectively, a ratio of two orders of magnitude. The bright mode is also superior in terms of the geometric factor Gm, 59 versus 51 for the dark mode.

Simulations by the inventors demonstrate that the filling factor can be further enhanced by optimizing the distance between the posts P, and the height of the cavity (see FIGS. 12$a$ and 12$b$). The vertical grey strips in FIGS. 12$a$, 12$b$ and 13 mark the dimensions of the cavity used in actual experiments described below. A decrease in post spacing to the diameter of the YIG sphere results in a filling factor increase up to 0.12, whereas reducing the cavity height to the smallest possible value results in a filling factor of 0.05. It is believed that applying both optimizations together would result in a filling factor of 0.2, potentially an order of magnitude larger. Altering these parameters, however, results in an increase of the cavity eigenfrequencies. This drawback can be overcome by adjusting the size of the post gap, to which the cavity resonance frequency is extremely sensitive (as depicted in FIG. 13) but the filling factor is completely insensitive. Reducing the gap G size leads not only to a decrease in the cavity eigenfrequency, but also to an increase of the geometric factor Gm. Two other major parameters, namely the post radius and the cavity diameter do not significantly change the value of the filling factor, although they can be also used to manipulate the resonant frequency.

Figure 14:
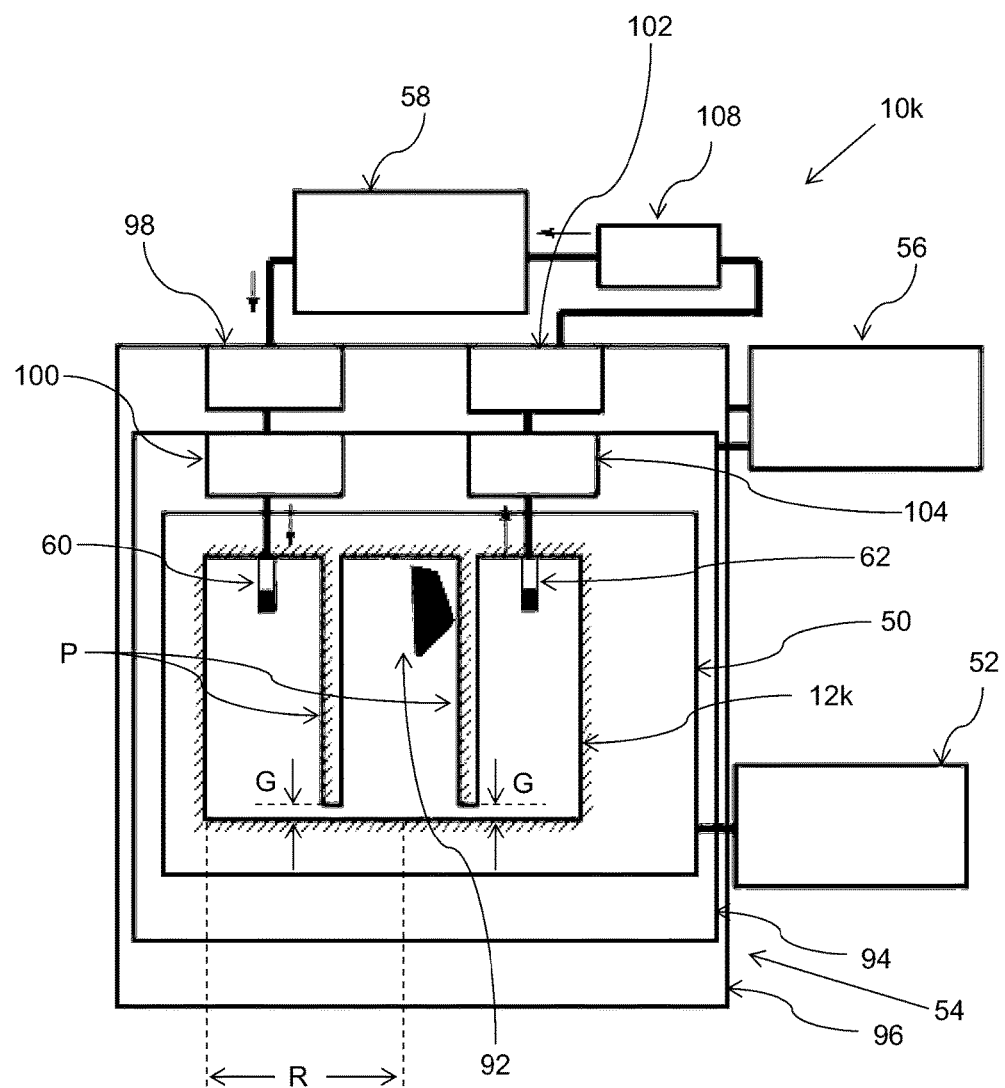
FIG. 14 is a representation of an experimental set up utilizing an embodiment of the system based on the system of FIG. 11 for measuring photon-magnon coupling.

FIG. 14 is a representation of an actual experimental set up for measuring photon-magnon coupling. The set-up is based on the magnetic field spectrometer of FIG. 7 and is designated here as system 10$k$. The system 10$k$ comprises a two post cavity 12$k$ fabricated from Oxygen-Free High Conductivity (OFHC) copper with an internal radius R of 5 mm. The posts P have a radius of 0.4 mm, and post gap G of 73 μm. After insertion of the YIG sphere 92 between the posts, the cavity is cooled to about 20 mK by means of a first stage 94 of a cryo-cooler 54 in the form of a Dilution Refrigerator (DR) with a cooling power of about 500 μW at 100 mK. The cavity 12$k$ is attached to a OFHC copper rod bolted to a mixing chamber stage of the DR that places it at the field center a 7 T superconducting magnet 50. The magnet 50 is attached to a 4K stage 96 of the DR, with the cavity mounted within a ~100 mK radiation shield that sits within the bore of the magnet.

A commercially available YIG sphere 92 with a diameter 0.8 mm attached to a standard Beryllium oxide cylindrical post was used for the experiment. A cylindrical hole was made in the bottom of the cavity at the mid-point of the distance between the cavity posts P in order to hold the sphere 92 by its Beryllium oxide holder (not shown) in between the posts P.

The cavity modes are excited by a loop probe 60 constructed from flexible SMA cable launchers, and measurements are performed through a second loop probe 62. The incident signals are attenuated by a series of cold attenuators 98, and 100 at 4K (−10 dB) and at 20 mK (−20 dB) respectively before reaching the cavity. The transmitted signal is then amplified by a cryogenic low noise amplifier 102. The cryogenic amplifier 102 and the cavity 12 are separated by an isolator 104 situated at the first stage 94 to prevent back action noise from the higher temperature stage. A final amplification is made by amplifier 108 at room temperature prior to input to the analyzer 58.

The cavity response was measured in an applied external DC magnetic field swept from 0 to 0.9 T. The maximum driving efficiency of magnon modes by a microwave field is achieved when the microwave (i.e. alternating) magnetic field is perpendicular to the static magnetic bias field.

Accordingly, since the microwave magnetic field vector is in the plane normal to the posts P, the DC magnetic field is oriented parallel to the cavity posts.

Figure 15:
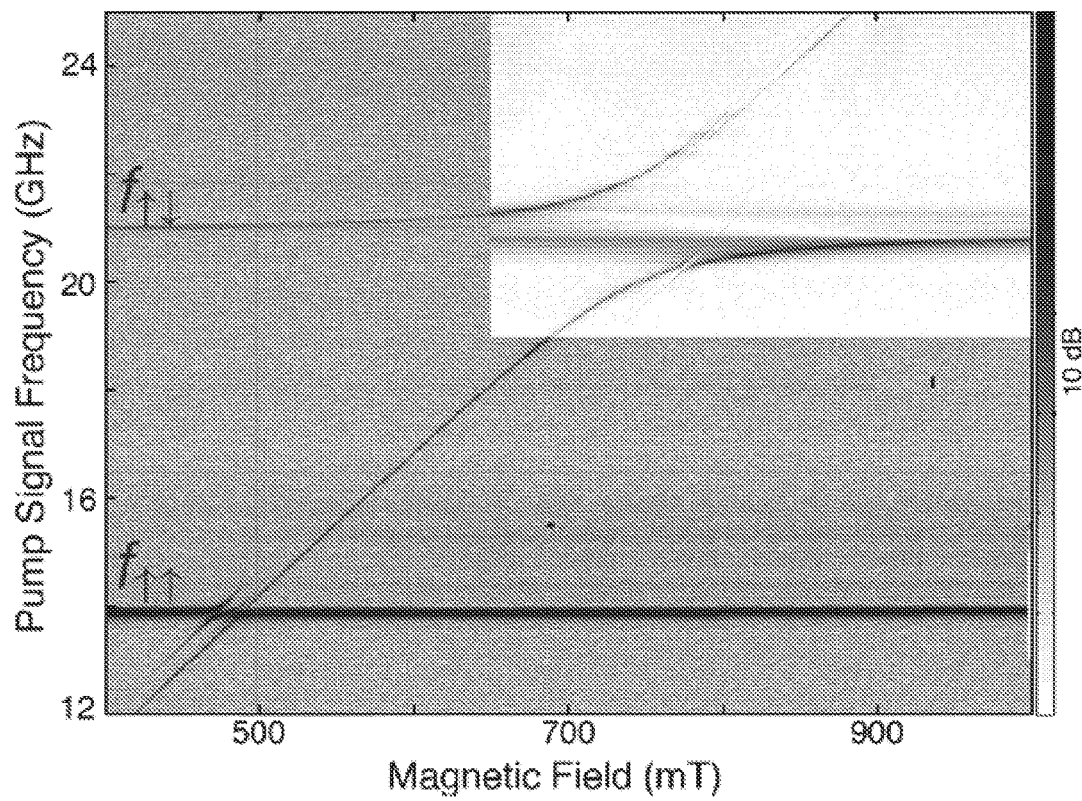
FIG. 15: Depicts a density plot of the transmission through the cavity as a function of frequency and applied DC magnetic field.

FIG. 15 demonstrates the microwave response of the cavity with a YIG sphere 92 located between the posts P of the experimental set up of FIG. 14. The response is shown in form of a density plot as a function of external magnetic field applied parallel to the posts P, with darker colour corresponding to higher transmission. The upper right section of the density plot has a different signal-to-noise ratio than the rest of the data due to the utilization of a different (higher frequency bandwidth) room temperature amplifier in that region. The two horizontal lines of higher transmission labelled as $f\uparrow\uparrow$=13.9 GHz and $f\uparrow\downarrow$=20.9 GHz correspond to the dark and bright cavity modes respectively. The line of higher transmission that grows almost linearly with the magnetic field represents the magnon mode of uniform precession in the YIG sphere 92.

Figure 16:
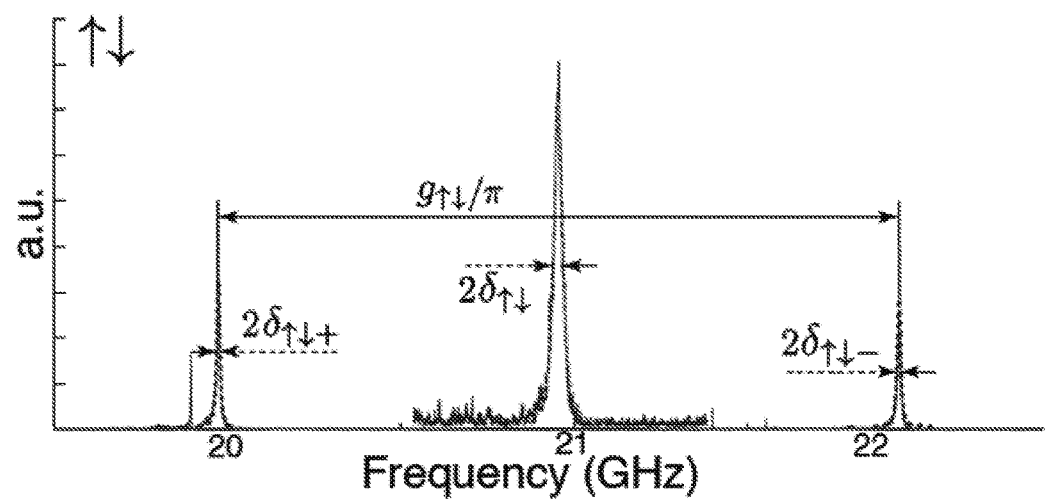
FIG. 16: Depicts the frequency response of the interaction between the f↑↓ cavity mode and the magnon mode at B=0.743 T, and the bare cavity mode outside resonance.

The density plot reveals the existence of several avoided crossings between the magnon modes of the sphere 92 and the two cavity modes. The strongest interaction is observed between the bright cavity mode and the magnon mode. The corresponding strong coupling regime achieved at B=0.743 T is demonstrated in FIG. 16. This plot displays transmission through the cavity 12k outside the interaction (the peak in the center at around 21 GHz), i.e. when no crystal response is present. The same response would be observed if the crystal 92 is not in the cavity. The two side peaks at 19 and 22 GHz are cavity response at the strong interaction regime where the bright cavity mode and the magnon YIG mode are hybridized and no distinction between a photon and magnon can be made. The strength of the coupling $g\uparrow\downarrow/(2\pi)$ is approximately 2 GHz, which is 10% of the corresponding resonance frequency $f\uparrow\downarrow$ qualifying it as ultra-strong coupling as discussed above.

The cavity linewidths are 33 and 27 MHz for the dark and bright modes. Using these results and the simulated values of the geometric factor Gm, it is estimated that the effective surface resistance of the cavity is about 76 mΩ. It should be noted that the cavity was fabricated from the Oxygen-Free Copper and was not optimized in terms of loss. In particular, the inner surfaces of the cavity had not been polished. The surface resistance of ultra-pure polished copper at millikelvin temperatures is about 9 mΩ, which could result in a considerable reduction of cavity bandwidths.

This work has been extended to cavities with a two-dimensional array of posts, allowing superstrong coupling between photons and magnons using four post and eight post cavities. Two-dimensional cavities were previously described in a general sense with reference to FIGS. 4 and 5. More specifically FIGS. 17Aa-17Ad (referred to collectively as FIG. 17A) illustrate simulations of electric field distribution within the gaps inside a cavity containing a two-dimensional array of four posts (N=4) while FIGS. 17Ba-17Bd (referred to collectively as FIG. 17B) illustrate electric field distribution within the gaps inside a eight post (N=8) cavity. The cavity modes are shown as a function of increasing frequency (from left to right) for each of FIGS. 17A and 17B. There exist additional three higher- and one lower-frequency cavity modes for the eight post cavity which are not shown. In FIGS. 17A and 17B the dots with a white outer ring or halo represent electric field in one direction with the solid black dots representing electric field in the opposite direction.

The location of posts in the four post (N=4) cavity correspond to the locations of the electric fields shown in the FIG. 17Aa and FIG. 17Ad and correspond to the vertices of a square. The location of posts in the eight post (N=8) cavity correspond to the locations of the electric fields shown in FIGS. 17Bc and 17Bd. Here the eight posts are arranged in the configuration of a cross with four posts equally spaced along each arm of the cross and no post at the intersection of the arms.

The experimental setup and conditions were similar to that shown in FIG. 14 (although of course with four and eight posts instead of two) and with the cavities and straight excitation antennas being fabricated of Oxygen Free Copper and thermalized to a 20 mK stage of a dilution refrigerator inside a superconducting magnet. The excitation signal is attenuated by 40 dB at various stages of the cryocooler, whereas the output signal is amplified by a cold low noise amplifier.

The four post cavity of FIG. 17A demonstrates four modes with the following combination of post current directions at the same moment: $\uparrow\uparrow\uparrow\uparrow$ (FIG. 17Aa); 0↓0| (FIG. 17Ab); $\uparrow$0↓0 (FIG. 17Ac); and $\uparrow\downarrow\uparrow\downarrow$ (FIG. 17Ad) where 0 denotes the post with no current. In the ideal case, the second and the third modes are degenerate in frequency because one is π/2 rotation of another. They mimic so-called Whispering Gallery Mode (WGM) doublet, a pair of sine and cosine waves, and the mode structure may be understood as a discrete WGM system. This particular doublet represents a WGM of the order n=2, since it has two nodes. For each resonance of the doublet all four posts are involved in oscillation even though two of them are not illuminated at some instance of time. In an actual experiment, the symmetry is broken leading to lifting of the mode degeneracy with the frequency splitting depending on the cavity imperfections. This type of an avoided crossing is typical to spin-photon interaction in the cavity with time-reversal symmetry breaking where WGM doublets are formed by travelling waves.

The eight post cavity of FIG. 17B (N=8) may be regarded as two perpendicular discrete Fabry-Perot resonators made of four posts each. It is important to note that the second and the third modes of this structure in FIGS. 17Ba and 17Bb respectively are modes of two linear Fabry-Perot resonators made by two chains of four posts.

The experimental results of magnon-photon interaction for the four and eight post cavities of FIGS. 17A and 17B are shown in FIGS. 18A and 18B respectively as function of the driving frequency and the external magnetic field. The dashed curves are theoretical predictions for the system eigenfrequencies.

FIG. 18A demonstrates an Avoided-Level Crossing (ALC) between one of the cavity doublet modes and a magnon resonance. The other doublet mode does not interact with the YIG sphere for symmetry reasons. FIG. 18B shows the magnetic field response for the case of N=8, where the magnon resonance line exhibits a number of ALCs with cavity modes.

Figure 19A:
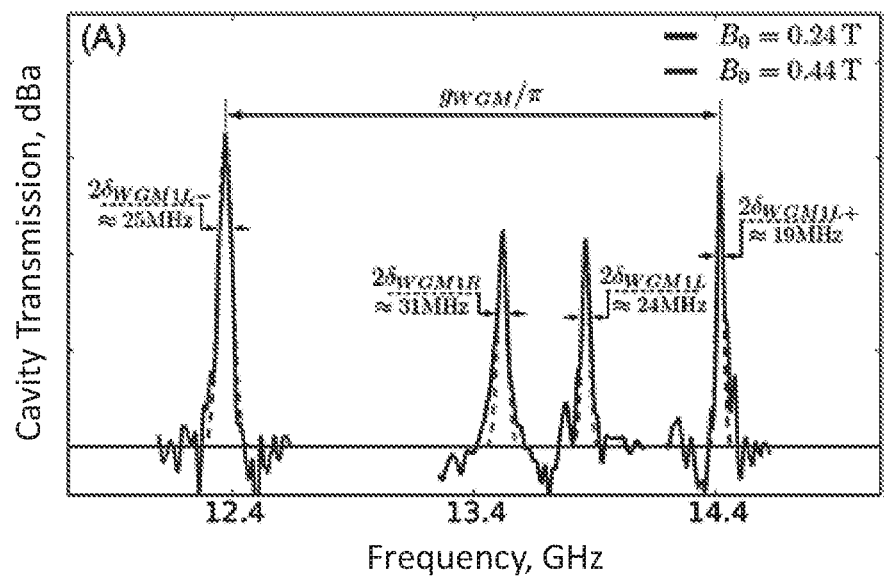
FIGS. 19A and 19B illustrate the transmission through four and eight post cavities of FIGS. 17Aa and 17Ba respectively.
Figure 19B:
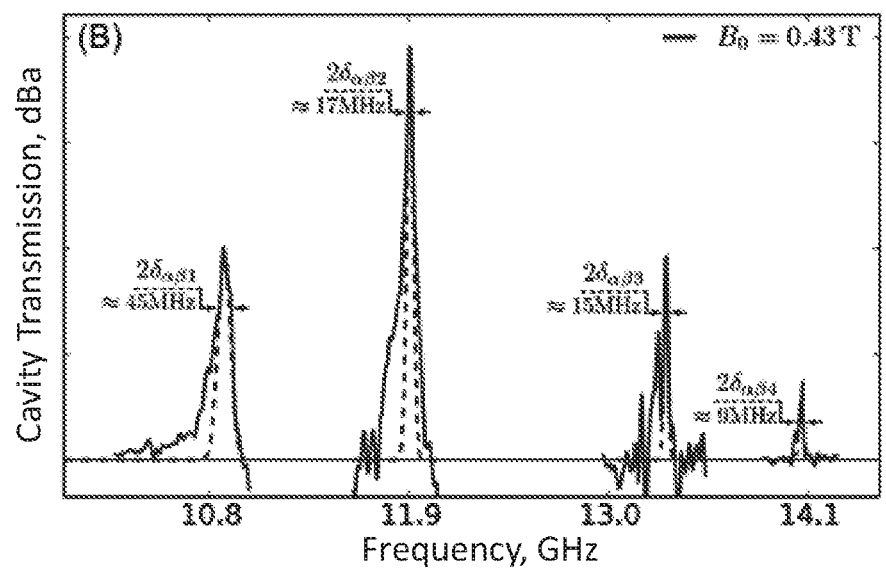

FIGS. 19A and 19B illustrate the transmission through N=4 and N=8 post cavities of FIGS. 17A and 17B respectively, as function of the driving frequency for a chosen external magnetic field. FIG. 19A shows the frequency response of the interaction between the $WGM_{1L}$ and $WGM_{1R}$ cavity modes (i.e. the two middle cavity modes shown in FIGS. 17Ab and 17Ac) and the magnon mode. FIG. 19B shows the resonant frequency response of the eight post cavity, demonstrating superstrong coupling. Dashed curves represent Lorentzian fits to the data.

Embodiments of the disclosed system facilitate the creation of a discrete approximation to any kind of 1D or 2D cavities. Moreover, it is possible to arrange the posts in the cavities into arrays creating a next level of organisation. For instance, it is possible to design a 2D array cavity which in effect simulates several Fabry-Perot cavities with close enough resonances, such that it is possible to control their frequency individually. In principle, this feature may be used for quantum state transfer and memory. An illustrative example is shown in FIGS. 20A-20E which illustrates possible magnetic field distribution for a cavity that consists of four 1D re-entrant multi post sub arrays. In these Figures there is one horizontal array of posts that may be considered to be, or act as a bus resonator (bus line) 101, and three vertical arrays of posts that may be considered as respective memory resonators 103a, 103b and 103c.

The system is designed in such a way that the bus line supports two resonances (in this case —second and third harmonic of a line, $\omega b1$ and $\omega b2$) and memory modes (fundamental resonances of three independent lines $\omega m1$-$\omega m3$). For this particular design: $\omega b1 < \omega m1 \sim \omega b2 \sim \omega m3 < \omega b2$. No other system mode is located in between. The difference between resonance frequencies of the memory modes is primarily due to imperfections of the numerical model (mesh) breaking the system symmetries.

The results of FEM simulation (see FIGS. 20A-20E) show that the five modes described above may be regarded as normal modes of the stand-alone sub-systems, e.g. the bus or memory resonator. This comes from the fact that none of the foreign posts are illuminated while one of these subsystems is at the resonance giving all the magnetic field is concentrated in the corresponding regions of this subsystem. Thus, small regions of the cavity space may be addressed individually at the corresponding resonance frequencies, so it is possible to put spin ensembles or qubits at these positions for individually addressing.

It is noted that none of the sub-resonators of the system share the same posts. Thus it is possible to control the resonance frequencies of the memory and bus modes individually through mechanical manipulation of the corresponding post gaps. This can be achieved for example by use of a piezo-electric actuator as described in relation to FIG. 11. This facilitates an exchange of excitations between the bus and memory modes by tuning their frequencies through each other.

As previously described a remarkable feature of the disclosed re-entrant post cavity is that system resonance is associated only with a post with a gap. When a post gap disappears, for example by short circuiting a post between opposite sides of a cavity, the resonance frequency approaches zero. This may be utilized to control the number of resonators and their geometry. Such a system is based on the 2D array shown in a general sense in FIGS. 4 and 5. The system has a 2D array of posts organized into a regular rectangular grid, with a post at each grid location. But in effect any grid location can look or act as if it has no post by removing the gap of the post (which is equivalent to providing a zero gap) at such locations, i.e. by shorting the posts. Accordingly by assigning non-zero gaps only to certain posts, one can create chains and other structures of coupled oscillators on a 2D array. So, due to the re-entrant cavity feature, only the posts with gaps will participate in propagation of the electromagnetic energy. The other (shorted or zero-gap) posts, will work as screening medium.

Thus, by controlling existence of these gaps, one can manipulate with photonic paths on a 2D lattice. This can be achieved by the use of a programmable system associated with the posts which enables user selectable gap sizes (including zero gap, i.e. a shorted post) for each post individually. The provision of the programmable system also enables static or dynamic tuning while a signal is propagated through the cavity.

In one embodiment the programmable system may be in the form of a piezoelectric actuator 88 described in relation to FIG. 11. As piezoelectric devices can be activated by application of a voltage, the gap between a post and the cavity surface can be varied dynamically. Also one can program a cavity with a 2D or 3D array of variable gap posts so that the gap for each post can be individually set, including to be a zero-gap (i.e. short circuit). This concept of Programmable Cavity Arrays has certain similarities with the well-known Field-Programmable Gate Arrays (FPGA) that revolutionized digital computing and emerging Field-Programmable Analog Array (FPAA).

FIGS. 21A-21F depict electric field distributions for various transmission modes for three examples of the post arrangements in a programmable cavity 12m. The cavity 12m of FIGS. 21A-21F is a rectangular cavity with a regular 8×15 array of variable gap posts, i.e. posts having a variable or tunable gap. The cavity 12m may be equipped with microwave field source ports on the left and sink ports on the right (not shown). In these Figures a white dot is representative of a short circuited or zero gap post. The red/blue (or if printed in black and white, the shaded fuzzy) dots represent the electric filed in the gap of the other posts. Points in the array having no dots are representative of the location of non-zero gap posts which do not participate in signal transmission for the given operating conditions, or have very small electric fields which while present are not visible in the Figures.

FIGS. 21A and 21B illustrate the cavity 12m programmed to provide a symmetric interferometric system with constructive interference in FIG. 21A and destructive interference in FIG. 21B. FIGS. 21C and 21D illustrate the same cavity 12m programmed to provide an asymmetric two channel system with frequency selective paths. FIGS. 21E and 21F illustrate the same cavity 12m programmed to provide a two input system with two types of interaction.

The programmable cavity 12m may be understood as a system performing a linear (empty system) or nonlinear (in presence of nonlinear components inside) transform from N inputs XN to N outputs YN parametrically dependent on user defined N by M matrix AN, M of bits ($A \in \{0, 1\}$): Y=F (A, X), where N and M are a number of rows and columns in the array. By choosing an appropriate matrix AN, M one can design a microwave system for a particular experiment. This approach helps to generalize the process of the microwave system design giving a flexible approach to system building.

Embodiments of the disclosed cavity may also be operated as highly tunable multi-mode filters due to the existence of several modes of the multi post cavities. Such systems have applications in multi band antennas or as highly tunable notch filters for communications jamming. It is possible to use all of the possible resonant mode frequencies of the cavity which is equal to the number of posts.

Band gap filters and isolators could be realized using a multi post metamaterial with posts of different size/gaps/ spacings, leading to the creation of wide band gaps for isolation purposes. In addition the proposed type of metamaterial is a convenient tool to study novel structures of solids such as quasicrystals in one and two dimensions which is not possible with real matter.

In conclusion, embodiments of the system 10 enable ultra-strong coupling of 2 GHz between a photonic mode of a magnetic field-focusing microwave cavity 12 and magnon resonances of a sub-millimeter size YIG sphere 92. Utilizing embodiments of the system 10 has enabled the filling factor and resonance frequency problem imposed by the small size of the sphere to be solved. Due to the very narrow line widths and high spin density, magnon resonances of YIG are of particular interest to the realization of hybrid quantum systems since they allow many limitations of paramagnetic spin systems to be overcome. Also while the system 10 is termed or designated as "a microwave frequency magnetic field manipulation system", without any change to its structure or operation the system 10 could equally be termed or designated as "a re-entrant microwave cavity system" which comprises the microwave cavity 12 as described above in connection with all embodiments and one or more microwave signal sources. The above description is also a disclosure of a re-entrant microwave cavity 12 (and all descried variations) per se as descried above and in which the size of the gaps can be varied or tuned. This includes varying the gap size to zero in which case the post is shorted circuited across the cavity. In such an instance there will be no electric field associated with that post and therefore no magnetic field circulating about (i.e. centered on) that post.

The invention claimed is:

1. A microwave frequency magnetic field manipulation system comprising:
a re-entrant microwave cavity resonator having a substantially continuous and closed internal surface with at least two opposed sides, and at least two posts which are in physical contact with a first of the at least two opposed sides and extend toward a second of the two opposed sides the at least two posts being dimensioned or positionable to form or enable the formation of respective gaps between free ends posts and the second of the two opposed sides; and
one or more signal sources coupled to the cavity for supplying microwave signals at resonant frequencies above the fundamental frequency of the cavity to facilitate the generation of electric fields in the gaps and associated magnetic fields in opposite direction about two mutually adjacent ones of the at least two posts such that the magnetic fields reinforce each other in a focusing region between the at least two mutually adjacent posts.

2. The microwave frequency magnetic field manipulation system according to claim 1 comprising a cooling system capable of cooling the cavity to milliKelvin temperatures.

3. The microwave frequency magnetic field manipulation system according to claim 1 comprising a DC electric field generator arranged to produce an electric field, separate to the electric fields generated by the one or more sources, extending across the gaps in a direction parallel to a length direction of the at least two posts.

4. The microwave frequency magnetic field manipulation system according to claim 1 comprising a tuning system arranged to enable variation of dielectric properties of the each gap independently of each other.

5. The microwave frequency magnetic field manipulation system according to claim 4 wherein the tuning system comprises a mechanism capable of varying a length dimension of each gap independently of each other.

6. The microwave frequency magnetic field manipulation system according to claim 4 wherein the tuning system comprises one or more pieces of dielectric material configured to be capable of insertion into and removal from respective gaps.

7. The microwave frequency magnetic field manipulation system according to claim 1 wherein the at least two posts are arranged in a one dimensional array.

8. The microwave frequency magnetic field manipulation system according to claim 1 wherein the at least two posts are arranged in a two dimensional array.

9. The microwave frequency magnetic field manipulation system according to claim 1 wherein the at least two posts are arranged in a three dimensional array.

10. The microwave frequency magnetic field manipulation system according to claim 1 comprising a programmable system associated with the at least two posts and capable of selectively varying the size of the gap for each post individually including closing the gap to zero wherein a respective one of the at least two posts is short circuited across opposed sides of the cavity.

11. The microwave frequency magnetic field manipulation system according to claim 1 comprising a DC magnetic field generator arranged to produce a magnetic field, separate to the magnetic fields generated by one or more sources, having lines of flux extending parallel to a length direction of the at least two posts.

12. The microwave frequency magnetic field manipulation system according to claim 1 comprising a crystal resonator disposed in the focusing region between the mutually adjacent posts.

13. The microwave frequency magnetic field manipulation system according to claim 12 wherein the crystal resonator is a single crystal resonator.

14. A method of producing a focused magnetic field in a multi-post re-entrant microwave cavity resonator having a plurality of posts, each post having one end in direct physical contact with a first portion of an inner surface of the cavity and an opposite end located or positionable to form or enable the formation of a respective gap with a second portion of the inner surface, the method comprising: exciting the cavity with microwave signals at second or higher harmonic frequencies to facilitate generation of electric fields in the respective gaps in directions to form corresponding magnetic fields in opposite direction about adjacent ones of the plurality of posts such that the magnetic fields reinforce each other in respective focusing regions generated between adjacent ones of the plurality of posts.

15. The method according to claim 14 comprising evacuating the cavity of a first fluid and subsequently at least partially filling the cavity with a second fluid which is different to the first fluid.

16. The method according to claim 14 comprising placing a crystal resonator in at least one of the focusing regions generated about adjacent ones of the plurality of posts when the cavity is excited with microwave signals at second or higher harmonic frequencies.

17. The method according to claim 14 further comprising inducing ultra-strong photon magnon coupling by:
placing a crystal resonator in at least one of the focusing regions; and exciting the cavity at second or higher order eigen-frequencies to produce at least two magnetic fields such that the magnetic fields reinforce each other in the at least one of the focusing regions.

18. The method according to claim 17 comprising configuring the cavity relative to the crystal resonator to provide a cavity photon to crystal magnon coupling of at least 2 GHz.

19. The method according claim 14 comprising at least partially filling the cavity with a fluid.

20. The method according to claim 14 comprising configuring the cavity relative to the crystal resonator to provide a filling factor of at least 10%.

* * * * *